(12) United States Patent
Beardsworth et al.

(10) Patent No.: US 12,445,098 B2
(45) Date of Patent: Oct. 14, 2025

(54) SWITCHING AMPLIFIER CIRCUITRY

(71) Applicant: Cirrus Logic International Semiconductor Ltd., Edinburgh (GB)

(72) Inventors: Matthew Beardsworth, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 552 days.

(21) Appl. No.: 17/885,719

(22) Filed: Aug. 11, 2022

(65) Prior Publication Data
US 2024/0056039 A1   Feb. 15, 2024

(51) Int. Cl.
*H03F 3/217*   (2006.01)
*H03F 1/02*   (2006.01)

(52) U.S. Cl.
CPC ......... *H03F 3/2173* (2013.01); *H03F 1/0222* (2013.01); *H03F 1/0233* (2013.01); *H03F 1/025* (2013.01); *H03F 1/0255* (2013.01); *H03F 2200/105* (2013.01); *H03F 2200/351* (2013.01); *H03F 2200/459* (2013.01); *H03F 2200/462* (2013.01); *H03F 2200/471* (2013.01); *H03F 2200/481* (2013.01)

(58) Field of Classification Search
CPC ...... H03F 3/2173; H03F 1/0222; H03F 1/025; H03F 1/0233; H03F 1/0255; H03F 2200/105; H03F 2200/351; H03F 2200/459; H03F 2200/462; H03F 2200/471; H03F 2200/481
USPC .......................................................... 330/10
See application file for complete search history.

(56) References Cited

U.S. PATENT DOCUMENTS

| 5,809,420 A | * | 9/1998 | Ichiyanagi | H03G 3/3047 |
| | | | | 455/430 |
| 9,787,261 B2 | * | 10/2017 | Lesso | H03F 3/187 |
| 2003/0035554 A1 | * | 2/2003 | Cho | H03F 3/217 |
| | | | | 381/94.5 |

(Continued)

FOREIGN PATENT DOCUMENTS

| CN | 104238702 A | * 12/2014 | |
| CN | 109067209 A | * 12/2018 | H02H 7/1257 |

OTHER PUBLICATIONS

International Search Report and Written Opinion of the International Searching Authority, International Application No. PCT/GB2023/051624, mailed Sep. 22, 2023.

*Primary Examiner* — Andrea Lindgren Baltzell
*Assistant Examiner* — Lance Torbjorn Bartol
(74) *Attorney, Agent, or Firm* — Jackson Walker L.L.P.

(57) ABSTRACT

Switching amplifier circuitry for driving an inductive load, the switching amplifier circuitry comprising modulator circuitry and output stage circuitry, wherein the switching amplifier circuitry is configured to: while the modulator circuitry is outputting a modulated output signal that gives rise to ripple current in the load: adjust a switching frequency of the modulator circuitry over a predetermined range of frequencies; monitor a power of the switching amplifier circuitry as the switching frequency is adjusted over the predetermined range of frequencies; and select, as an operational switching frequency for the modulator circuitry, a frequency within the predetermined range of frequencies at which the monitored power meets a predefined criterion.

28 Claims, 12 Drawing Sheets

(56) References Cited

U.S. PATENT DOCUMENTS

| | | | |
|---|---|---|---|
| 2005/0083114 A1* | 4/2005 | Risbo | H03F 3/217 |
| | | | 330/10 |
| 2005/0152561 A1* | 7/2005 | Spencer | H04B 11/00 |
| | | | 381/77 |
| 2006/0072657 A1* | 4/2006 | Putzeys | H03M 3/506 |
| | | | 375/238 |
| 2012/0038294 A1 | 2/2012 | Schulz et al. | |
| 2014/0312968 A1* | 10/2014 | Ikriannikov | H03H 7/0115 |
| | | | 330/10 |
| 2015/0311778 A1* | 10/2015 | Chang | H02M 3/33507 |
| | | | 363/21.16 |
| 2023/0126710 A1* | 4/2023 | Liu | H02M 1/0048 |
| | | | 363/13 |
| 2023/0261620 A1* | 8/2023 | Kuo | H03F 3/2173 |
| | | | 330/250 |

* cited by examiner

SWITCHING AMPLIFIER CIRCUITRY

FIELD OF THE INVENTION

The present disclosure relates to switching amplifier circuitry. In particular, the present disclosure relates to switching amplifier circuitry with reduced power consumption.

BACKGROUND

Switching amplifier circuitry such as Class D amplifier circuitry is commonly used to drive inductive loads such as output transducers such as speakers, actuators (e.g. resonant actuators such as linear actuators) and motors in a wide variety of electronic devices.

In some amplifier systems filter circuitry is provided between the output of the switching amplifier circuitry and the transducer to be driven, to filter out signal components at the switching frequency of the switching amplifier circuitry.

Other systems (sometimes referred to as filterless switching amplifiers) do not include any such filter circuitry, instead relying on the inductance of the load to filter out the switching frequency signal components.

FIG. 1 is a schematic representation of filterless switching amplifier circuitry. The filterless switching amplifier circuitry shown generally at 100 in FIG. 1 comprises switching amplifier circuitry 110 such as pulse width modulation (PWM) amplifier circuitry which is configured to receive an input signal Sin and output a drive signal Sout to an inductive load 120 such as a transducer (e.g. a speaker, or resonant actuator) or motor, which is represented in FIG. 1 as a series combination of a resistance 122 and an inductance 124. The drive signal Sout may be a voltage signal that switches between two or more different discrete voltage levels.

One feature of switching amplifier-based systems that drive an inductive load is ripple current, which arises because of the switching voltage that is present at the terminals of the load during operation of the amplifier circuitry as a result of the interaction between the drive signal Sout and the inductance of the load. This is illustrated in FIG. 2, which shows the switching voltage at the terminals of the load over time. As can be seen, during a positive pulse of the switching voltage, current in the load inductance increases. During a negative pulse of the switching voltage, current in the load inductance decreases. The change in the load current di/dt is related to the magnitude of the switching voltage V and the load inductance L by the relationship:

$$di/dt = V/L \qquad (1).$$

This changing load current is referred to as ripple current, and is undesirable, since the ripple current represents an out of band power loss in the load.

In filterless switching amplifier circuitry of the kind shown in FIG. 1, the switching frequency $F_0$ is typically much higher than the maximum desired bandwidth of the signal output by the load 120, such that the average or filtered drive signal Sout represents the desired output signal with sufficient resolution. In some applications it is possible to reduce the switching frequency $F_0$ significantly without adversely affecting the resolution of the signal output by the load 120.

Reducing the switching frequency can have the effect of reducing switching losses in the amplifier circuitry 110, because the energy lost per unit time in an output stage driver of the amplifier circuitry 110, and/or in a gate capacitance of transistor (e.g. a field effect transistor or FET) of the output stage driver is reduced. As will be appreciated by those of ordinary skill in the art, capacitive power loss $P_{CAP}$ can be expressed as $$P_{CAP} = \tfrac{1}{2} C F_0 V^2, \qquad (2)$$

where C is the capacitance (e.g. the gate capacitance of an output stage transistor), $F_0$ is the switching frequency and V is the switching voltage which develops across the capacitance.

Thus, reducing the switching frequency $F_0$ will have the effect of reducing capacitive power losses in the amplifier circuitry 110.

Additionally, assuming that the time for which the output stage transistor is operating in its active region per cycle of the output signal Sout is the same for all switching frequencies, resistive power losses in the output stage transistor caused by the load current (e.g. power losses that arise due to the load current and a drain resistance of the output stage transistor) may also be reduced by reducing the switching frequency $F_0$, since at lower switching frequencies the output stage transistor does not slew through its active region as often per unit time as at higher switching frequencies.

However, for a load of a given inductance, reducing the switching frequency will increase the ripple current in the load, thus causing the ripple power delivered to the load to increase.

It follows from equation (1) above that the ripple current di can be expressed as:

$$di = dt(V/L), \qquad (3)$$

where dt is equal to the duty cycle of the output signal Sout multiplied by the reciprocal of the switching frequency $F_0$ of the amplifier circuitry 110 (and thus of the drive signal Sout), i.e. dt=duty cycle*$1/F_0$.

As will be appreciated, the ripple current di is thus inversely proportional to the switching frequency $F_0$.

Thus, in applications in which the output signal bandwidth is low, it may be possible to reduce capacitive and/or resistive losses (and thus power consumption) by reducing the switching frequency $F_0$, but this comes at a cost of increased losses due to ripple current in the load.

Hence, to optimise power consumption in such applications it is desirable to find a switching frequency $F_0$ at which, for a given load, a balance between reduced capacitive and/or resistive losses and increased ripple current losses can be achieved to reduce power consumption to a minimum or optimum level. As will be appreciated by those of ordinary skill in the art, the switching frequency $F_0$ at which power consumption is at a minimum will be different for different loads, as it is dependent upon the inductance of the load.

SUMMARY

According to a first aspect, the invention provides switching amplifier circuitry for driving an inductive load, the switching amplifier circuitry comprising:
  modulator circuitry; and
  output stage circuitry, wherein the switching amplifier circuitry is configured to:
    while the modulator circuitry is outputting a modulated output signal that gives rise to ripple current in the load:
      adjust a switching frequency of the modulator circuitry over a predetermined range of frequencies;

monitor a power of the switching amplifier circuitry as the switching frequency is adjusted over the predetermined range of frequencies; and select, as an operational switching frequency for the modulator circuitry, a frequency within the predetermined range of frequencies at which the monitored power meets a predefined criterion.

The monitored power may comprise an input power to the amplifier circuitry, and the switching amplifier circuitry may further comprise input power monitoring circuitry for monitoring the input power.

The circuitry may be configured to select, as the operational switching frequency, a frequency within the predetermined range at which a minimum monitored input power to the switching amplifier circuitry occurs.

The input power monitoring circuitry may comprise input current monitor circuitry for monitoring an input current to the switching amplifier circuitry.

The input power monitoring circuitry may further comprise input voltage monitor circuitry for monitoring an input voltage to the switching amplifier circuitry.

The modulator circuitry may comprise Class D modulator circuitry operable in a Class BD operating mode or a Class AD operating mode.

The output stage circuitry may comprise single ended output stage circuitry.

The modulator circuitry may be operable in its Class AD mode or its Class BD mode to output the modulated output signal that gives rise to ripple current in the load.

The output stage circuitry may comprise differential output stage circuitry.

The modulator circuitry may be operable in its class AD mode to output the modulated output signal that gives rise to ripple current in the load.

The switching amplifier circuitry may further comprise pilot or test signal generator circuitry operable to supply a pilot or test signal to an input of the modulator circuitry. The output stage circuitry may comprise differential output stage circuitry, and the modulator circuitry may be operable in its Class BD mode to output a modulated output signal that gives rise to ripple current in the load based on the pilot or test signal.

The pilot or test signal may comprise:
a sinusoidal signal having predefined amplitude and/or frequency and/or phase characteristics;
a variable amplitude sinusoidal signal; or
a DC signal of fixed or variable amplitude.

In some examples, the switching amplifier circuitry may be configured to have zero PWM switching at idle and the switching amplifier circuitry may further comprise pilot or test signal generator circuitry operable to supply a pilot or test signal to an input of the modulator circuitry. The modulator circuitry may be operable to output a modulated output signal that gives rise to ripple current in the load based on the pilot or test signal.

In some examples, the switching amplifier circuitry may be configured to have zero PWM switching at idle, and the switching amplifier circuitry may comprise multi-mode modulator circuitry. The modulator circuitry may be operable to change its operating mode so as to output a modulated output signal that gives rise to ripple current in the load when no input signal is present.

The monitored power may comprise an output power of the amplifier circuitry, and the switching amplifier circuitry may further comprise load ripple current power monitoring circuitry for monitoring the output power. The switching amplifier circuitry may be configured to select, as the operational switching frequency, a frequency within the predetermined range at which a minimum monitored output power of the switching amplifier circuitry occurs.

The load ripple current power monitoring circuitry may comprise load current monitor circuitry and load voltage monitor circuitry.

The switching amplifier circuitry may be operable to change the operating mode of the modulator circuitry based on a characteristic or parameter of an input signal to the switching amplifier, and the operational switching frequency may be selected based at least in part on an average input power over time for the Class AD operating mode and the Class BD operating mode.

The switching amplifier circuitry may be operable to change the operating mode of the modulator circuitry based on a characteristic or parameter of an input signal to the switching amplifier, and the switching amplifier circuitry may be configured to adjust the operational switching frequency based on a current or future operating mode of the modulator circuitry.

A modulation index of the modulated output signal may be variable.

The switching amplifier circuitry may further comprise load impedance detector circuitry configured to detect an impedance of the load, and the switching amplifier circuitry may be operable to adjust the operational switching frequency based on a difference between the detected impedance of the load and a reference impedance for the load.

The reference impedance for the load may comprise a stored predefined impedance value or a stored calibration impedance value determined during a calibration of the switching amplifier circuitry.

The load impedance detector circuitry may be configured to detect the impedance of the load based on a voltage across the load and a current through the load as a pilot or test signal of a predetermined frequency is input to the modulator circuitry.

The switching amplifier circuitry may receive a supply voltage from a power source external to the switching amplifier circuitry.

The supply voltage may be adjustable based on the detected impedance of the load.

The switching amplifier circuitry may be configured to adjust the switching frequency of the modulator circuitry:
during a production process of the switching amplifier circuitry; and/or
on start-up of the switching amplifier circuitry; and/or
in response to a periodic initiation signal received from a host device that incorporates the switching amplifier circuitry; and/or
continuously; and/or
in response to a power consumption of the switching amplifier circuitry straying outside of a predefined limit; and/or
in response to a change in one or more characteristics of the load; and/or
in response to a change in an operating characteristic of the switching amplifier circuitry.

The modulator circuitry may comprise pulse width modulator (PWM) circuitry.

The switching amplifier circuitry may be configured to monitor the power continuously, intermittently or periodically.

According to a second aspect, the invention provides switching amplifier circuitry for driving an inductive load, the switching amplifier circuitry comprising:
modulator circuitry;

output stage circuitry; and
power loss comparator circuitry,
wherein the power loss comparator circuitry is configured to perform a comparison of a power loss associated with a ripple current in the load to a switching loss model for the switching amplifier circuitry,
and wherein the switching amplifier circuitry is configured to control a switching frequency of the modulator circuitry based on the comparison.

The switching amplifier circuitry may further comprise output power detector circuitry configured to generate a signal indicative of the power loss associated with the ripple current.

The power loss associated with the ripple current in the load may be based on a ripple power loss model for the switching amplifier circuitry.

According to a third aspect, the invention provides an integrated circuit comprising switching amplifier circuitry according to the first aspect.

According to a fourth aspect, the invention provides a host device comprising switching amplifier circuitry according to the first aspect.

The host device may comprise: a laptop, notebook, netbook or tablet computer; a gaming device; a games console; a controller for a games console; a virtual reality (VR) or augmented reality (AR) device; a mobile telephone; a portable audio player; a portable device; or an accessory device for use with: a laptop, notebook, netbook or tablet computer; a gaming device; a games console; a VR or AR device; a mobile telephone; a portable audio player; or another portable device.

BRIEF DESCRIPTION OF THE DRAWINGS

Embodiments of the invention will now be described, strictly by way of example only, with reference to the accompanying drawings, of which.

DETAILED DESCRIPTION

The present disclosure relates to switching amplifier circuitry, and in particular to switching amplifier circuitry that is capable of selecting an operational switching frequency at which a power consumption of the amplifier circuitry is optimised, minimised, or at least reduced.

Figure 1:
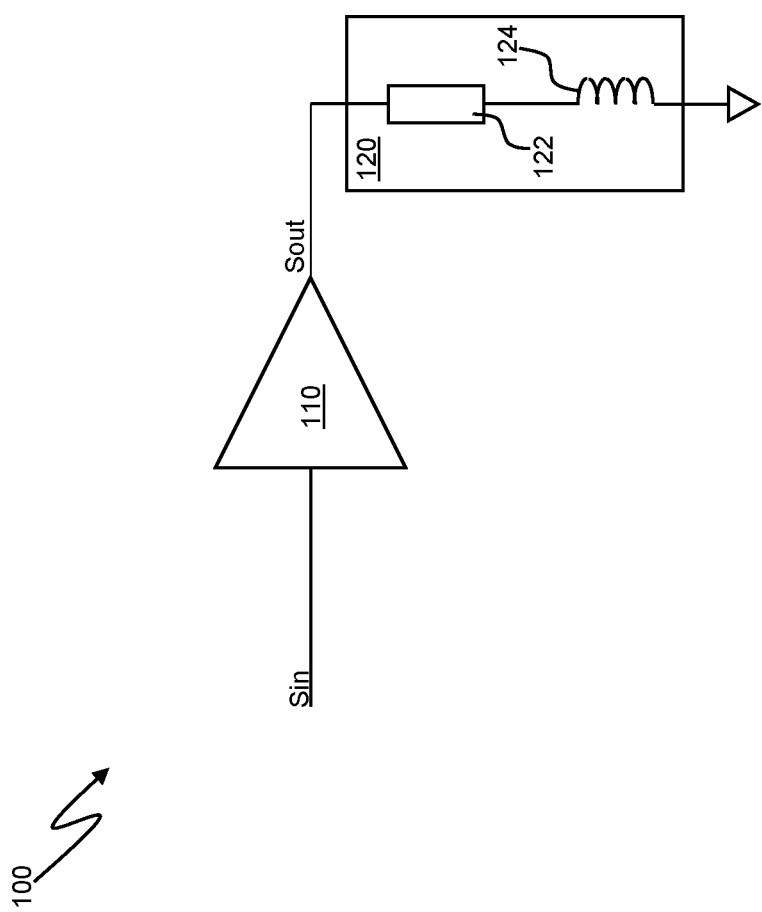
FIG. 1 is a schematic representation of filterless switching amplifier circuitry.
Figure 2:
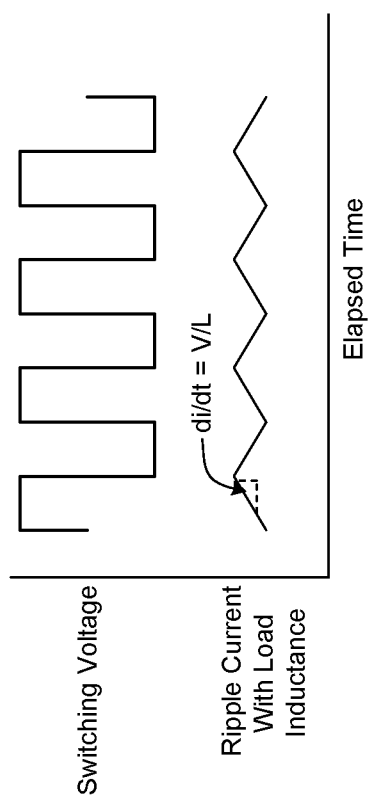
FIG. 2 illustrates ripple current in an inductive load as a result of the interaction between a switching voltage applied to the load and the inductance of the load.
Figure 3:
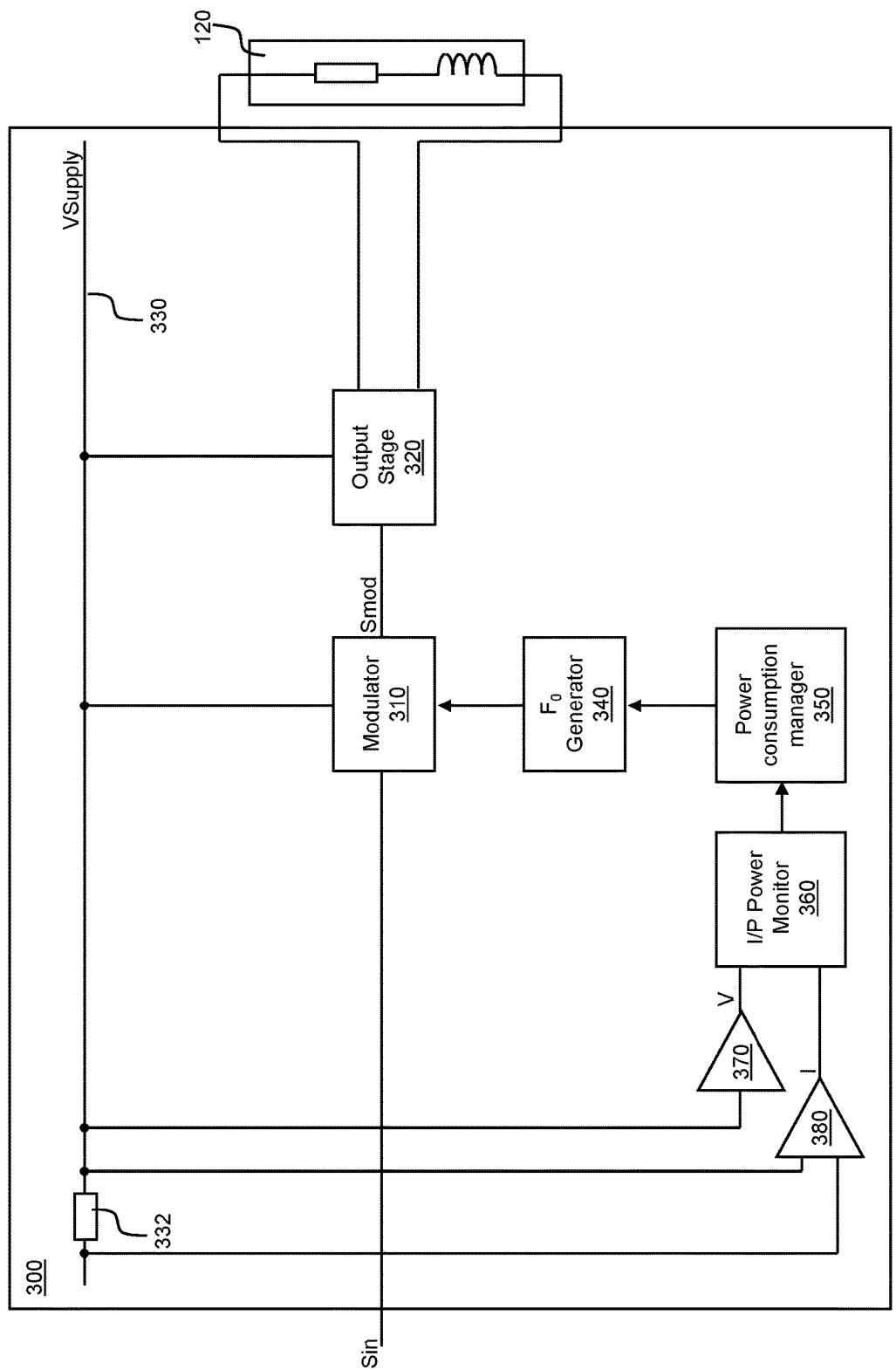
FIG. 3 is a schematic representation of example switching amplifier circuitry according to the present disclosure.

Referring now to FIG. 3, example switching amplifier circuitry for driving an inductive load 120 such as an audio transducer (e.g. a speaker or the like), a haptic transducer (e.g. a resonant actuator such as a linear resonant actuator) or a motor is shown generally at 300.

The switching amplifier circuitry 300 in this example comprises modulator circuitry 310, output stage circuitry 320, switching frequency generator circuitry 340, power consumption manager circuitry 350, and input power monitor circuitry 360.

The modulator circuitry 310 is configured to receive an amplifier input signal Sin and to generate a modulated output signal Smod, which is output to the output stage circuitry 320. The modulator circuitry may be, for example, pulse width modulator circuitry configured to generate a pulse width modulated (PWM) modulator output signal Smod.

The modulator circuitry 310 may comprise Class AD modulator circuitry, class BD modulator circuitry, or mutimode modulator circuitry operable selectively in a class AD mode or a class BD mode.

The output stage circuitry 320 is configured to generate one or more switching voltage output signals, based on the modulator output signal Smod, for driving the load 120. Examples of topologies for the output stage circuitry 320 are described in more detail below with reference to FIGS. 4 and 6.

The modulator circuitry 310 and the output stage circuitry 320 receive a supply voltage from a supply voltage rail 330 (also labelled VSupply in FIG. 3). A current sense resistor 332 is provided in the supply rail to permit monitoring of current drawn by the modulator circuitry 310 and the output stage circuitry 320, as will be described in more detail below.

The switching frequency generator circuitry 340 is configured to generate an output signal which defines the switching frequency of the modulator circuitry 310. In some examples the switching frequency generator circuitry 340 may be configured to output a reference signal to the modulator circuitry 310, with the frequency of this output reference signal defining the switching frequency of the modulator circuitry 310. In other examples the modulator circuitry 310 may include its own internal reference frequency generator and the switching frequency generator circuitry 340 may output a control signal to cause the modulator circuitry 310 to select or adjust the frequency of its internal reference signal.

The power consumption manager circuitry 350 is configured to control the switching frequency generator circuitry 340 based on an indication of an input power to the modulator circuitry 310 and output stage circuitry 320, which is supplied to the power consumption manager circuitry 350 by the input power monitoring circuitry 360.

The switching amplifier circuitry 300 further includes voltage sense amplifier circuitry 370 having an input coupled to the supply voltage rail 330 and an output coupled to a first input of the input power monitoring circuitry 360. Thus the voltage sense amplifier circuitry 370 is configured to output a signal V (e.g. a voltage) indicative of the voltage of the supply voltage rail 330, and thus the voltage supplied to the modulator circuitry 310 and the output stage circuitry 320.

The switching amplifier circuitry 300 further includes current sense amplifier circuitry 380 having first and second inputs coupled to respective first and second terminals of the current sense resistor 332 and an output coupled to a second input of the input power monitoring circuitry 360. Thus the current sense amplifier circuitry 380 is configured to output a signal I (e.g. a voltage) indicative of the current in the supply voltage rail 330, and thus the input current to the combination of the modulator circuitry 310 and the output stage circuitry 320.

The input power monitoring circuitry 360 is configured to generate a signal indicative of the input power to the modulator circuitry 310 and output stage circuitry 320, based on the signals received from the voltage sense amplifier circuitry 370 and the current sense amplifier circuitry 380.

To determine a switching frequency $F_O$ for the modulator circuitry 310 that balances reduced capacitive and/or resistive losses and increased ripple current losses, the power consumption manager circuitry 350 outputs appropriate control signals to trigger a power optimisation sequence.

During the power optimisation sequence, a modulated output signal Smod is output by the modulator circuitry 310 to cause the output stage circuitry 320 to output an output signal that causes ripple current in the load 120. The power consumption manager circuitry 350 monitors the signal indicative of the input power as the switching frequency of the modulator circuitry 310 is adjusted over a predefined frequency range by the switching frequency generator circuitry 340. For example, the switching frequency generator circuitry 340 may automatically sweep through the predefined frequency range.

A switching frequency within the predefined frequency range at which a minimum input power level occurs (as represented by the signal indicative of the input power) is identified by the power consumption manager circuitry 350, and the identified switching frequency is selected by the power consumption manager circuitry 350 as an operational switching frequency for the modulator circuitry 310 for subsequent operation of the switching amplifier circuitry 300.

Monitoring the input power as the switching frequency is adjusted during the power optimisation sequence in this way ensures that all amplifier and load interactions are taken into account when selecting the operational switching frequency to optimise, minimise or at least reduce power consumption. Such interactions may include, for example, load ripple losses, load hysteresis losses, amplifier switching losses, losses in parasitic capacitances and the like.

For some configurations of the modulator circuitry 310 and the output stage circuitry 320, the modulator circuitry 310 will output a modulated output signal Smod that causes a switching voltage to be output to the load 120 when the switching amplifier circuitry 300 is in an idle state, i.e., when no input signal Sin is supplied to the modulator circuitry 310.

Figure 4:
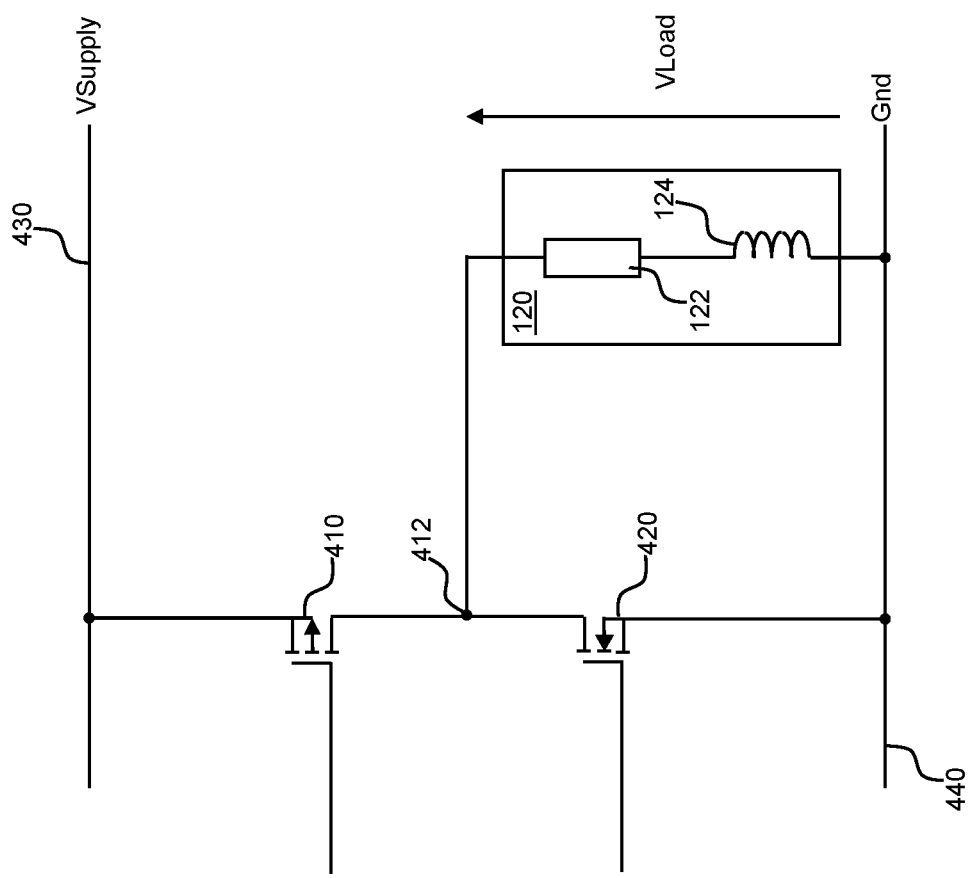
FIG. 4 is a schematic representation of example single-ended output stage circuitry suitable for use in the switching amplifier circuitry of FIG. 3.

FIG. 4 shows example single-ended output stage circuitry for use as the output stage circuitry 320 in the switching amplifier circuitry 300 of FIG. 3.

As shown generally at 400 in FIG. 4, the single-ended output stage circuitry comprises first and second complementary switches 410, 420 (which in this example are P-Channel and N-channel MOSFET devices respectively) coupled between a supply voltage rail 430 (also labelled VSupply in FIG. 4) and a ground (or other reference voltage) supply rail 440 (also labelled Gnd in FIG. 4).

A first terminal of the load 120 (represented in FIG. 4 as a series combination of a resistance 122 and an inductance 124) is coupled to a node 412 between the first and second switches 410, 420 and the ground rail 440. Input terminals of the switches 410, 420 receive modulated input signals based on the modulated signal Smod output by the modulator circuitry 310, and an output voltage VLoad develops across the load 120 as a result of switching of the switches 410, 420 in response to the received modulated input signals.

Figure 5:
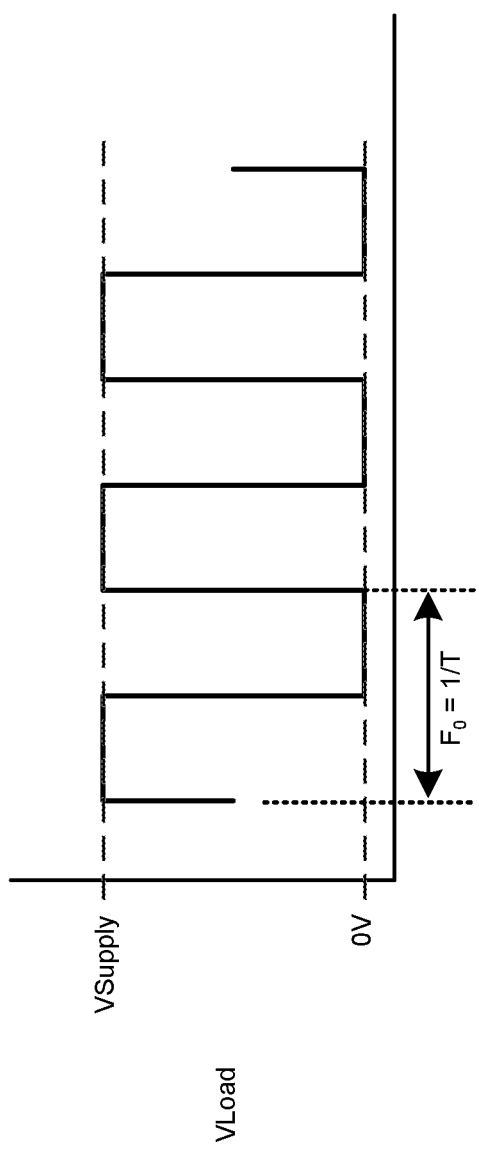
FIG. 5 illustrates an output voltage over time of the single-ended amplifier circuitry of FIG. 4.

FIG. 5 shows the output voltage VLoad of the output stage 400 over time with the switching amplifier circuitry 300 at idle. As can be seen, regardless of whether the modulator circuitry 310 outputs a Class AD or a Class BD modulated output signal, switching of the output voltage VLoad between two values (in this example VSupply and 0V) occurs every cycle of the switching frequency $F_O$ even when no input signal Sin is present at the input of the modulator circuitry 310, and thus ripple current is generated when the amplifier circuitry 300 is at idle.

Accordingly, an operational switching frequency that reduces or minimises power consumption can be identified and selected by monitoring the input power and adjusting the switching frequency of the modulator circuitry 310 over the predefined range as described above without any input signal Sin being applied during the power optimisation sequence.

Figure 6:
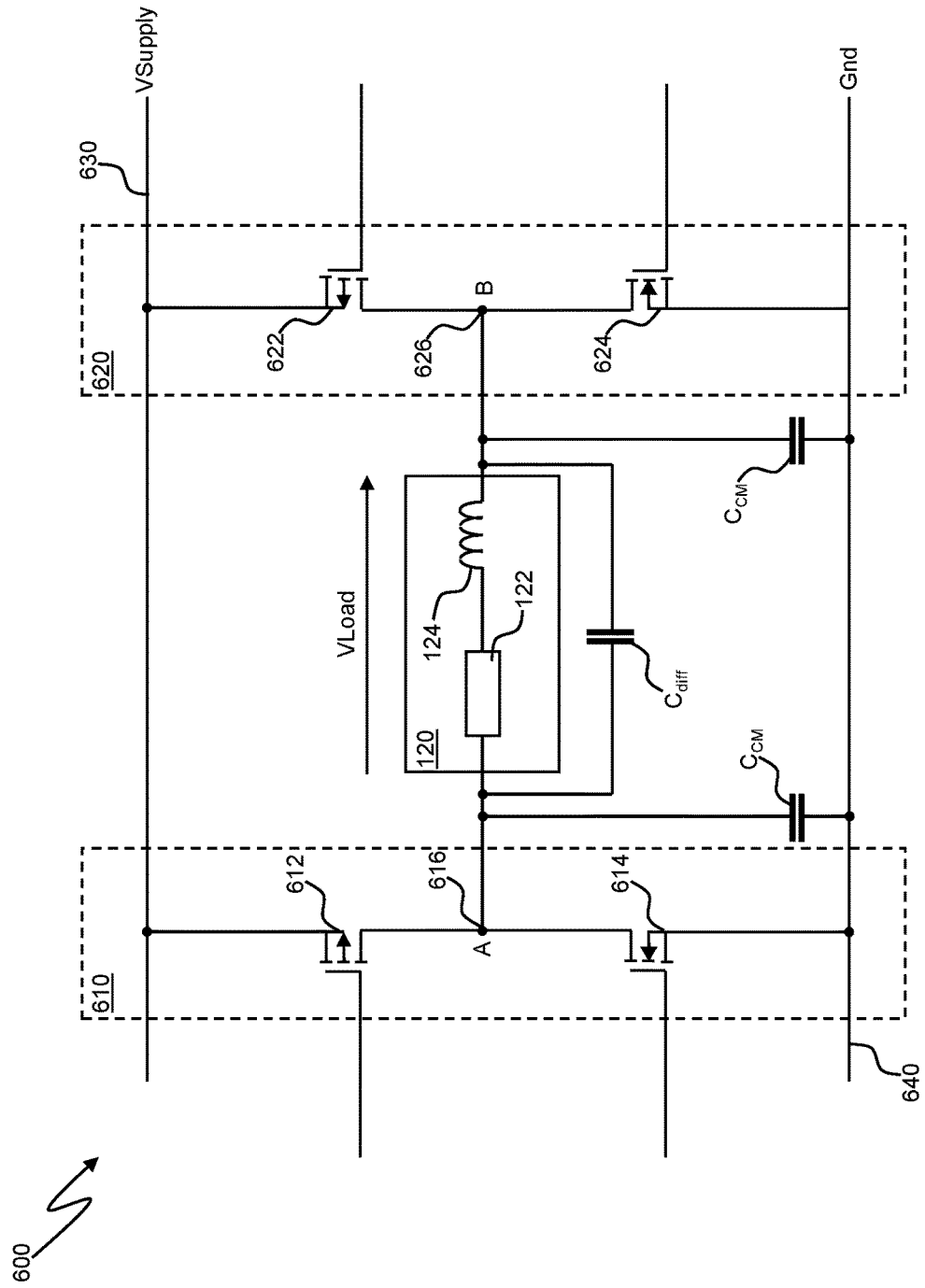
FIG. 6 is a schematic representation of example differential output stage circuitry suitable for use in the switching amplifier circuitry of FIG. 3.

FIG. 6 shows example differential output stage circuitry which can be driven by the modulator circuitry 310. As shown generally at 600 in FIG. 6, the differential output stage circuitry is configured as an H-bridge output stage comprising a first half-bridge 610 comprising first and second switches 612, 614 (which in this example are P-channel and N-channel MOSFET devices respectively) and a second half-bridge 620 comprising second and third switches 622, 624 (which in this example are P-channel and N-channel MOSFET devices respectively). The first and second half-bridges 610, 620 are coupled between a supply voltage rail 630 (also labelled VSupply in FIG. 6) and a ground (or other reference voltage) rail 640 (also labelled Gnd in FIG. 6).

The load 120 (represented in FIG. 6 as a series combination of a resistance 122 and an inductance 124) is coupled between a node 616 (also labelled A in FIG. 6) of the first half-bridge 610 and a node 626 (also labelled B in FIG. 6) of the second half-bridge 620 in a bridge tied load configuration. Input terminals of the switches 612, 614, 622, 624 receive modulated input signals based on the modulated signal Smod output by the modulator circuitry 310, and a differential output voltage VLoad develops across the load 120 as a result of switching of the switches 612, 614, 622, 624 in response to the received modulated input signals.

Figure 7B:
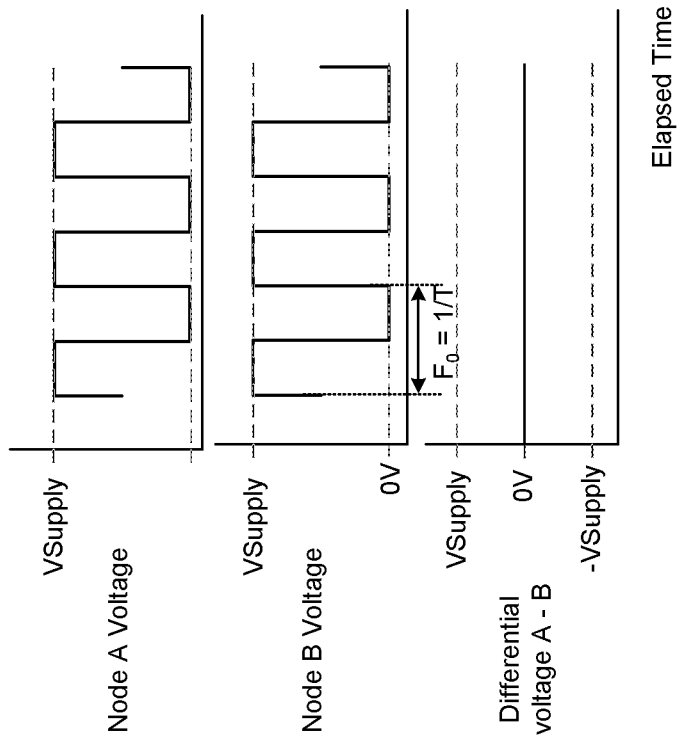
FIG. 7b illustrates a differential output voltage over time of the differential output stage circuitry of FIG. 6 when driven by a Class BD modulated signal.
Figure 7A:
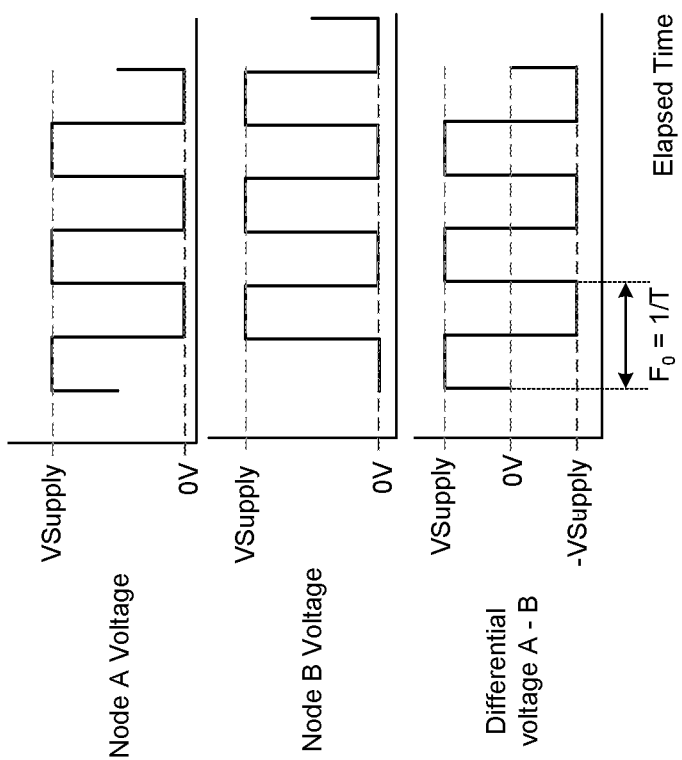
FIG. 7a illustrates a differential output voltage over time of the differential output stage circuitry of FIG. 6 when driven by a Class AD modulated signal.

FIG. 7a shows the output voltage VLoad of the output stage circuitry 600 over time with the switching amplifier circuitry 300 at idle when the modulator circuitry 310 is operative to output a Class AD modulated output signal with a 50% duty cycle.

As can be seen in FIG. 7a, when the output stage circuitry 600 is driven by a Class AD modulated signal with the amplifier at idle, the magnitude of the differential output voltage VLoad that develops across the load 120 is always either +VSupply or −VSupply and switches between these two values in every period of the switching frequency $F_O$ even when no input signal Sin is present at the input of the modulator circuitry 310, and thus ripple current is generated when the amplifier circuitry 300 is at idle.

Accordingly, an operational switching frequency that reduces or minimises power consumption can be identified and selected by monitoring the input power and adjusting the switching frequency of the modulator circuitry 310 over the predefined range as described above without any input signal Sin being applied during the power optimisation sequence.

FIG. 7b shows the output voltage VLoad of the output stage circuitry 600 over time with the switching amplifier circuitry 300 at idle when the modulator circuitry 310 is operative to output a Class BD modulated output signal with a 50% duty cycle.

As can be seen in FIG. 7b, when the output stage circuitry 600 is driven by a Class BD modulated signal with the amplifier circuitry 300 at idle, the magnitude of the differential output voltage VLoad that develops across the load 120 is always 0V, and thus no ripple current is generated when the amplifier circuitry 300 is at idle.

Accordingly, when the modulator circuitry 310 is configured or operating as a class BD modulator, in order to identify and select an operational switching frequency that reduces or minimises power consumption it is necessary either to supply a pilot or test signal to the modulator circuitry 310 as the input signal Sin during the power optimisation sequence, or to cause the mode of operation of the modulator circuitry 310 to switch to class AD mode prior to commencing the power optimisation sequence, to ensure that ripple current is generated in the load 120, before monitoring the input power and adjusting the switching frequency of the modulator circuitry 310 over the predefined range as described above.

Similar considerations apply to switching amplifier circuitry that has zero PWM switching at idle (i.e. amplifier circuitry where a level of a PWM output signal does not change if there is no input signal). Thus, if the amplifier circuitry 300 is configured to operate in this way, then in order to identify and select an operational switching frequency that reduces or minimises power consumption it is necessary to supply a pilot or test signal to the modulator circuitry 310 as the input signal Sin during the power optimisation sequence, or to cause the mode of operation of the modulator circuitry 310 to change (e.g. from class BD mode to class AD mode) prior to commencing the power optimisation sequence, to ensure that ripple current is generated in the load 120 when no input signal is present, before monitoring the input power and adjusting the switching frequency of the modulator circuitry 310 over the predefined range as described above.

Figure 8:
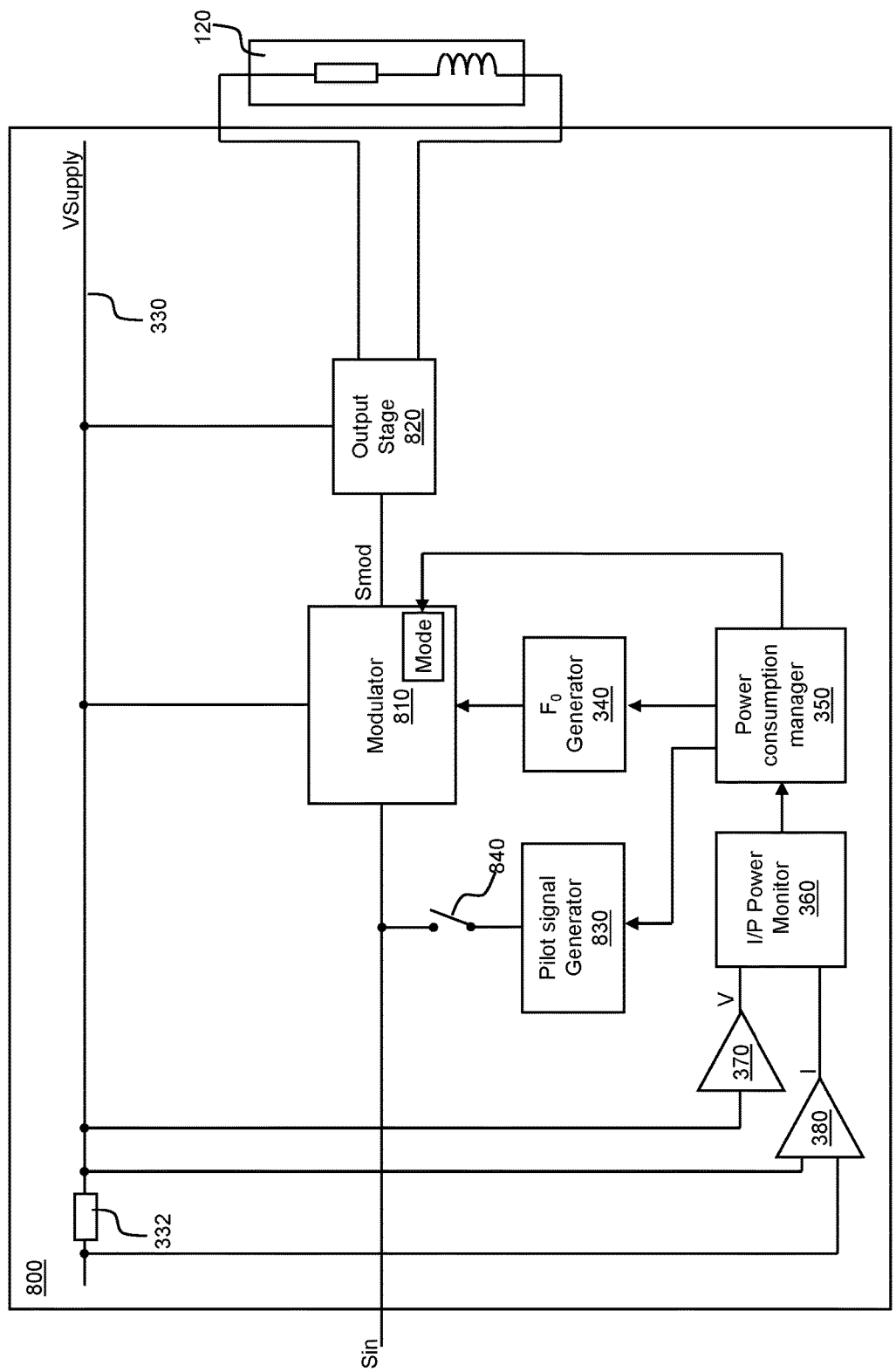
FIG. 8 is a schematic representation of alternative example switching amplifier circuitry according to the present disclosure.

FIG. 8 is a schematic representation of example switching amplifier circuitry for driving an inductive load 120 such as an audio transducer (e.g. a speaker or the like), a haptic transducer (e.g. a resonant actuator such as a linear resonant actuator) in which an operating mode of modulator circuitry can be adjusted and a pilot or test signal can be input to the modulator circuitry to facilitate identifying and selecting an operational switching frequency for the modulator circuitry that reduces or minimises power consumption.

The switching amplifier circuitry, shown generally at 800 in FIG. 8, includes a number of elements in common with the switching amplifier circuitry 300 of FIG. 3. Such common elements are denoted by common reference numerals in FIGS. 3 and 8, and will not be described again in detail here for reasons of clarity and brevity.

The switching amplifier circuitry 800 differs from the switching amplifier circuitry 300 of FIG. 3 in that it includes multi-mode modulator circuitry 810 that can switch between a Class BD operating mode and a Class AD operating mode in response to a mode control signal output by the power consumption manager circuitry 350, and in that the circuitry comprises differential output stage circuitry 820 (e.g. of the kind described above with reference to FIG. 6) configured to receive a modulated output signal Smod from the modulator circuitry 810 and drive the load 120. The modulator circuitry 810 may be, for example, PWM modulator circuitry.

Additionally, the switching amplifier circuitry 800 includes pilot or test signal generator circuitry 830, operative to generate and output a pilot or test signal having predefined frequency, amplitude and/or phase characteristics. For example, the pilot or test signal may be a sinusoidal signal of a predefined amplitude and frequency. The frequency of the pilot or test signal may be outside of (e.g., above or below) a response band of the load 120 to avoid effects that are perceptible to a user of a host device incorporating the switching amplifier circuitry 800, e.g. vibration, where the load is a haptic actuator, or audible frequency components, where the load is a speaker. Additionally, the amplitude of the pilot or test signal may be variable to vary the modulation depth of the modulated output signal Smod in a range from 0% to 100%.

Alternatively, the pilot or test signal may be a DC signal selected to have the effect of holding the switching amplifier circuitry 800 in a static modulation for a short period of time. In this case the level or amplitude of the DC signal could be adjusted (e.g. ramped or stepped) up or down over time to avoid any transducer or motor noise associated with a DC signal with a fast rising edge.

An output of the pilot or test signal generator circuitry 830 can be coupled to an input of the modulator circuitry 810 by means of a switch 840.

Thus, the switching amplifier circuitry 800 is operable in a normal operating mode in which the modulator circuitry 810 operates in a Class BD mode to generate a Class BD modulated output signal based on a received input signa Sin, and to output the Class BD modulated output signal Smod to the output stage circuitry 820.

The switching amplifier circuitry 800 is also operable in a first operational switching frequency selection mode in which the switch 840 is closed and the pilot or test signal generator circuitry 830 is enabled (e.g. in response to a suitable control signal output by the power consumption manager circuitry 350) to output a pilot or test signal to the input of the modulator circuitry 810. The first operational switching frequency selection mode may be used for the power optimisation sequence to ensure that ripple current is generated in the load 120, thereby to permit the identification and selection of an operational switching frequency for the modulator circuitry 810 that minimises or reduces power consumption.

The switching amplifier circuitry 800 may also be operable in a second operational switching frequency selection mode, in which the modulator circuitry 810 is switched into a Class AD mode (e.g. in response to a suitable control signal output by the power consumption manager circuitry 350) to output a class AD modulated signal Smod with a suitable duty cycle (e.g. 50%) to the output stage circuitry 820. In this second operational switching frequency selection mode, which may be used for the power optimisation sequence, there is no need to provide the pilot or test signal to the modulator circuitry 810, because (as explained above with reference to FIG. 7*a*) the use of a Class AD modulated signal ensures that the magnitude of the differential output voltage that develops across the load 120 switches between two values in every period of the switching frequency $F_O$ even when no input signal Sin is present at the input of the modulator circuitry 810, and thus ripple current is generated in the load 120 when the switching amplifier circuitry 800 is at idle, thus permitting the identification and selection of an operational switching frequency for the modulator circuitry 810 that minimises or reduces power consumption.

The switching amplifier circuitry 800 may be operable in a third operational switching frequency selection mode, in which the modulator circuitry 810 is switched into a Class AD mode (e.g. in response to a suitable control signal output by the power consumption manager circuitry 350) to output a class AD modulated signal Smod to the output stage circuitry 820 and the pilot or test signal generator circuitry 830 is enabled and the switch 840 is closed (e.g. in response to a suitable control signal output by the power consumption manager circuitry 350) so as to output a pilot or test signal to the input of the modulator circuitry 810. Again, this permits the identification and selection of an operational switching frequency for the modulator circuitry 810 that minimises or reduces power consumption, by performing the power optimisation sequence described above.

As will be appreciated by those of ordinary skill in the art, to facilitate the identification and selection of an optimal or beneficial operational switching frequency for the modulator circuitry 810 by monitoring the input power as described above when the modulator circuitry 810 is configured or operating as a Class BD modulator, it is only necessary either to switch the modulator circuitry 810 into its Class AD mode of operation and monitor the input power consumption while the switching frequency changes with the switching amplifier circuitry 800 at idle, or to supply a pilot or test signal to the modulator circuitry 810 and monitor the input power consumption while the switching frequency changes and the pilot or test signal is supplied to the modulator circuitry 810.

Thus, in some examples the pilot or test signal generator circuitry 830 and the associated switch 840 may be omitted, and the modulator circuitry 810 may be selectively operable in either a Class BD mode or a Class AD mode as described above.

In other examples the modulator circuitry 810 may be operable only in Class BD mode, and the pilot or test signal generator circuitry 830 and switch 840 may be provided and selectively operable to supply the pilot or test signal to the input of the modulator circuitry 810 as described above.

As is explained above with reference to FIG. 7*b*, for switching amplifier circuitry of the kind described above with reference to FIG. 8, which uses multi-mode modulator circuitry 810 and differential output stage circuitry 820, when the switching amplifier circuitry 800 is at idle (i.e. when there is no input signal Sin to the modulator circuitry 810) and the modulator circuitry 810 is operating in its Class BD mode, there is no differential voltage across the load 120. Thus, for each signal level transition in the output signals supplied to the load 120, power is only dissipated in common mode capacitances (labelled $C_{CM}$ in FIG. 6) of the output stage circuitry. In contrast, when the switching amplifier circuitry is delivering power to the load 120 (i.e. when an input signal Sin is present) with the modulator circuitry 810 operating in its Class BD mode, power is dissipated in the common mode capacitances $C_{CM}$ and in a differential mode capacitance (labelled $C_{diff}$ in FIG. 6), as well as in the load 120 as ripple current.

Thus selecting an operational switching frequency based on a minimum observed input power when the switching amplifier circuitry is at idle with the modulator circuitry 810 operating in its Class AD mode may not take into account the capacitive losses that occur during normal operation of the switching amplifier circuitry (i.e. when an input signal Sin is present) with the modulator circuitry 810 in its class BD mode. Thus the selected operational switching frequency may not provide the best balance between capacitive power losses and load ripple current power losses for all modes of operation of the modulator circuitry 810.

To improve the selection of the operational switching frequency to provide a better balance between capacitive power losses and load ripple current power losses, the input power to the modulator circuitry 810 and output stage circuitry 820 could be monitored (by means of the input power monitoring circuitry 360) as the switching frequency is adjusted over the predefined range with the modulator circuitry 810 operating in its Class AD mode and its Class BD mode. This approach would give rise to a first power consumption reference curve or characteristic defining the relationship between the switching frequency and the input power for operation of the modulator circuitry 810 in Class AD mode, and a second power consumption reference curve or characteristic defining the relationship between the switching frequency and the input power for operation of the modulator circuitry 810 in Class BD mode. The operational switching frequency could then be selected based on the expected modulation scheme of the switching amplifier circuitry.

For example, in the case where the switching amplifier circuitry is operative to change the mode of operation of the modulator circuitry based on a characteristic or parameter such as a signal level of the input signal Sin, the operational switching frequency could be selected based on an expected average modulation, e.g. based (at least in part) on an average input power over time for both the Class AD mode and the Class BD mode, such that the selected operational switching frequency is not optimised for either mode, but instead gives rise to reduced power consumption in both Class AD mode and Class BD mode.

Additionally, determining power consumption reference curves or characteristics for both Class AD and Class BD modes of operation permits the amplifier circuitry to dynamically adjust the operational switching frequency in accordance with a current or future operating mode of the modulator circuitry. For example, where the switching amplifier circuitry is operative to change the mode of operation of the modulator circuitry between Class AD and Class BD modes based on a parameter such as a signal level of the input signal Sin, if this input signal parameter is monitored (e.g. by the power consumption manager circuitry 350), a suitable operational switching frequency can be selected in advance of, or at the same time as, a change in the mode of operation of the modulator circuitry 810.

To further improve the selection of an operational switching frequency that minimises or reduces power consumption, a modulation index of the modulated output signal Smod could be adjusted in addition to adjusting the switching frequency while the input power to the modulator circuitry 810 and the output stage circuitry 820 is monitored by the input power monitoring circuitry 360. For example, a pilot or test signal could be supplied to the input of the modulator circuitry 810 by the pilot or test signal generator 830, and the amplitude of this signal could be adjusted continuously or in discrete steps to adjust the modulation index of the modulated output signal Sout between 0% (i.e. an idle state where there is no input signal to the modulator circuitry 810) and 100% (i.e. maximum differential load power).

In this way a set of further power consumption reference curves or characteristics defining the relationship between the switching frequency and the input power at different modulation indices can be determined, and subsequently used to select an optimum or at least beneficial operational switching frequency which balances switching power losses with load ripple current power losses for a given modulation index.

Selection of an operational switching frequency that takes account of modulation index may be performed, for example, as part of a calibration or start-up sequence of the switching amplifier circuitry.

In the examples described above, the input power to the modulator circuitry and the output stage circuitry of the switching amplifier circuitry is monitored as the switching frequency of the modulator circuitry is adjusted during the power optimisation sequence, either with the amplifier circuitry in an idle state or with a pilot or test signal being supplied to the modulator circuitry, to identify and select an optimum or beneficial operational switching frequency for the modulator circuitry to minimise or at least reduce the power consumption of the switching amplifier circuitry.

In other examples the power associated with the load ripple current can be measured or estimated, e.g. based on measurements of the load current and voltage, as the switching frequency of the modulator circuitry is adjusted during a power optimisation sequence, either with the amplifier circuitry in an idle state or with a pilot or test signal being supplied to the modulator circuitry, to identify and select an optimum or beneficial operational switching frequency for the modulator circuitry that minimises or at least reduces the power consumption of the switching amplifier circuitry.

Figure 9:
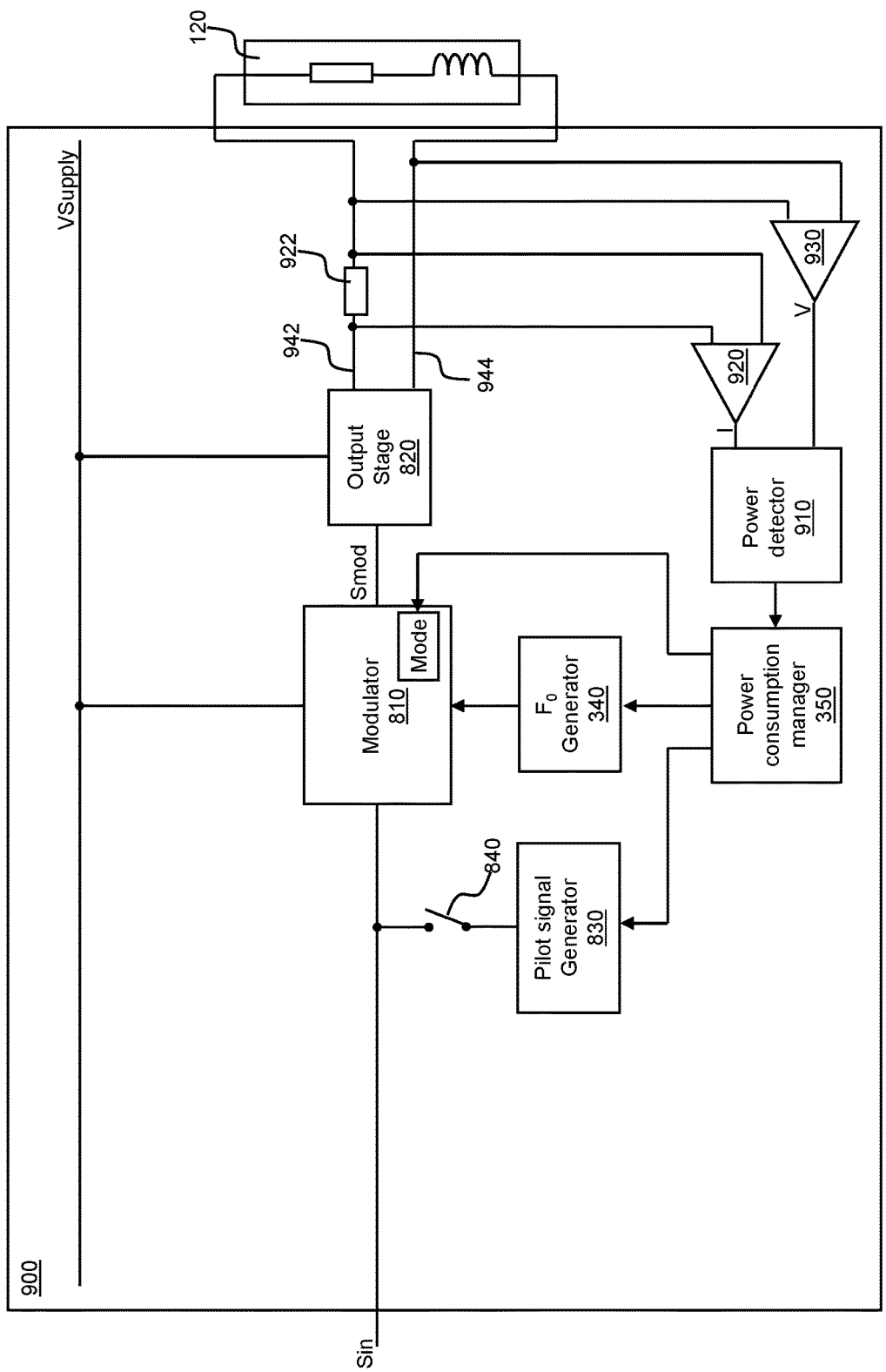
FIG. 9 is a schematic representation of further alternative example switching amplifier circuitry according to the present disclosure.

FIG. 9 is a schematic representation of further example switching amplifier circuitry for driving an inductive load 120 such as an audio transducer (e.g. a speaker or the like), a haptic transducer (e.g. a resonant actuator such as a linear resonant actuator).

The switching amplifier circuitry, shown generally at 900 in FIG. 9, includes a number of elements in common with the switching amplifier circuitry 800 of FIG. 8. Such common elements are denoted by common reference numerals in FIGS. 8 and 9, and will not be described again in detail here for reasons of clarity and brevity.

The switching amplifier circuitry 900 differs from the switching amplifier circuitry 800 in that it further includes load ripple power detector circuitry 910, output current sense amplifier circuitry 920 having an output coupled to a first input of the load ripple power detector circuitry 910, an output current sense resistor 922, and output voltage sense amplifier circuitry 930 having an output coupled to a second input of the load ripple power detector circuitry 910.

In the example circuitry shown in FIG. 9 the output stage circuitry 820 comprises differential output stage circuitry (e.g. of the kind described above with reference to FIG. 6) having first and second output signal paths 942, 944 for coupling first and second outputs of the output stage circuitry 820 to respective first and second terminals of the load 120. However, it will be appreciated by those of ordinary skill in the art that the output stage circuitry 820 could equally be single-ended output stage circuitry (e.g. of the kind described above with reference to FIG. 4) having only a first output signal path 942 for coupling the output of the output stage circuitry to a first terminal of the load 120, with a second terminal of the load 120 being coupled to ground or some other suitable reference voltage supply.

The output current sense resistor 922 is provided in the first output signal path 942, and first and second inputs of the output current sense amplifier circuitry 920 are coupled to respective first and second terminals of the output current sense resistor 922.

Thus the output current sense amplifier circuitry 920 is configured to output a signal (e.g. a voltage) indicative of the current in the first output signal path 942 (and thus through the load 120) to the first input of the load ripple power detector circuitry 910.

First and second inputs of the output voltage sense amplifier circuitry 930 are coupled to the first and second output signal paths 942, 944 respectively, such that the output voltage sense amplifier circuitry is configured to output a signal (e.g. a voltage) indicative of an output voltage across the load 120. (In alternative examples in which the output stage circuitry 320 is single-ended, the output voltage sense amplifier circuitry 930 may have only a single input coupled to an output signal path from the output stage circuitry 320 to the load 120.)

Thus, the output voltage sense amplifier circuitry 930 is configured to output a signal (e.g. a voltage) indicative of the voltage across the load 120 to the second input of the load ripple power detector circuitry 910.

The switching amplifier circuitry 900 may be operative in a first operational switching frequency selection mode to perform a power optimisation sequence to identify and select an operational switching frequency for the modulator circuitry 810. In the first operational frequency selection mode, the switch 840 is closed and the pilot or test signal generator circuitry 830 is enabled (e.g. in response to suitable control signals output by the power consumption manager circuitry 350) to output a pilot or test signal to the input of the modulator circuitry 810. As noted above, this ensures that ripple current flows in the load 120 when the modulator circuitry 810 is operating in its Class BD mode.

While the pilot or test signal is being output to the input of the modulator circuitry 810, the switching frequency of the modulator circuitry 310 is adjusted over a predefined frequency range by the switching frequency generator circuitry 340 (e.g. in response to suitable control signals output by the power consumption manager circuitry 350).

Alternatively, the switching amplifier circuitry 900 may be operative in a second operational switching frequency selection mode to perform a power optimisation sequence to identify and select an operational switching frequency for the modulator circuitry 810. In the second operational switching frequency selection mode, the modulator circuitry 810 is switched into a Class AD mode of operation and no input signal is supplied to the input of the modulator circuitry 810 (i.e. the switching amplifier circuitry 900 is at idle). As explained above, when the modulator circuitry 810 is operating in its Class AD mode ripple current flows in the load 120 even with no input signal to the modulator circuitry 810.

While the switching amplifier circuitry 900 operating in either the first or second operational switching frequency selection mode, the output current sense amplifier circuitry 920 outputs a load current signal (e.g. a voltage) indicative of the current through the load 120 to the first input of the load ripple power detector circuitry 910, and the output voltage sense amplifier circuitry 930 outputs a load voltage signal (e.g. a voltage) indicative of the voltage across the load 120 to the second input of the load ripple power detector circuitry 910.

The load ripple power detector circuitry 910 determines a power associated with the load ripple current based on the signals received from the output current sense amplifier circuitry 920 and the output voltage sense amplifier circuitry 930 (e.g. by multiplying the load current signal by the load voltage signal), and outputs a signal indicative of the power associated with the load ripple current to the power consumption manager circuitry 350.

To facilitate this determination of the power associated with the load ripple, the output current and voltage sense amplifier circuitry 920, 930 may include filter circuitry (e.g. high pass filter circuitry) configured to pass only signal components of the load current and voltage signals that relate to the high frequency load ripple current. Alternatively, separate filter circuitry may be provided in the signal paths between the output stage circuitry 820 and the load ripple power detector circuitry 910 for this purpose.

The power consumption manager circuitry 350 monitors the signal indicative of the power associated with the load ripple current as the switching frequency varies, and identifies a switching frequency, within the predefined frequency range, at which a minimum load ripple power level occurs. The identified switching frequency is selected by the power consumption manager circuitry 350 as an operational switching frequency for the modulator circuitry 310 for subsequent operation of the switching amplifier circuitry 300.

Monitoring the power associated with the load ripple current as the switching frequency is adjusted in this way permits an accurate estimate of the power losses associated with the load ripple current, and thus selecting an operational switching frequency for which this power is at its minimum is an effective way of optimising or at least reducing power consumption in the switching amplifier circuitry 900.

In some scenarios it may be beneficial to monitor an impedance of the load 120 to detect a difference between the actual load impedance and a rated or nominal impedance of the load 120. Such differences may arise, for example, due to changes in a temperature of the load or due to ageing of the load. Monitoring the load impedance allows the operational switching frequency to be selected or adjusted to compensate for any such variations in the load impedance, to optimise, minimise or at least reduce the power consumption of the switching amplifier circuitry.

Figure 10:
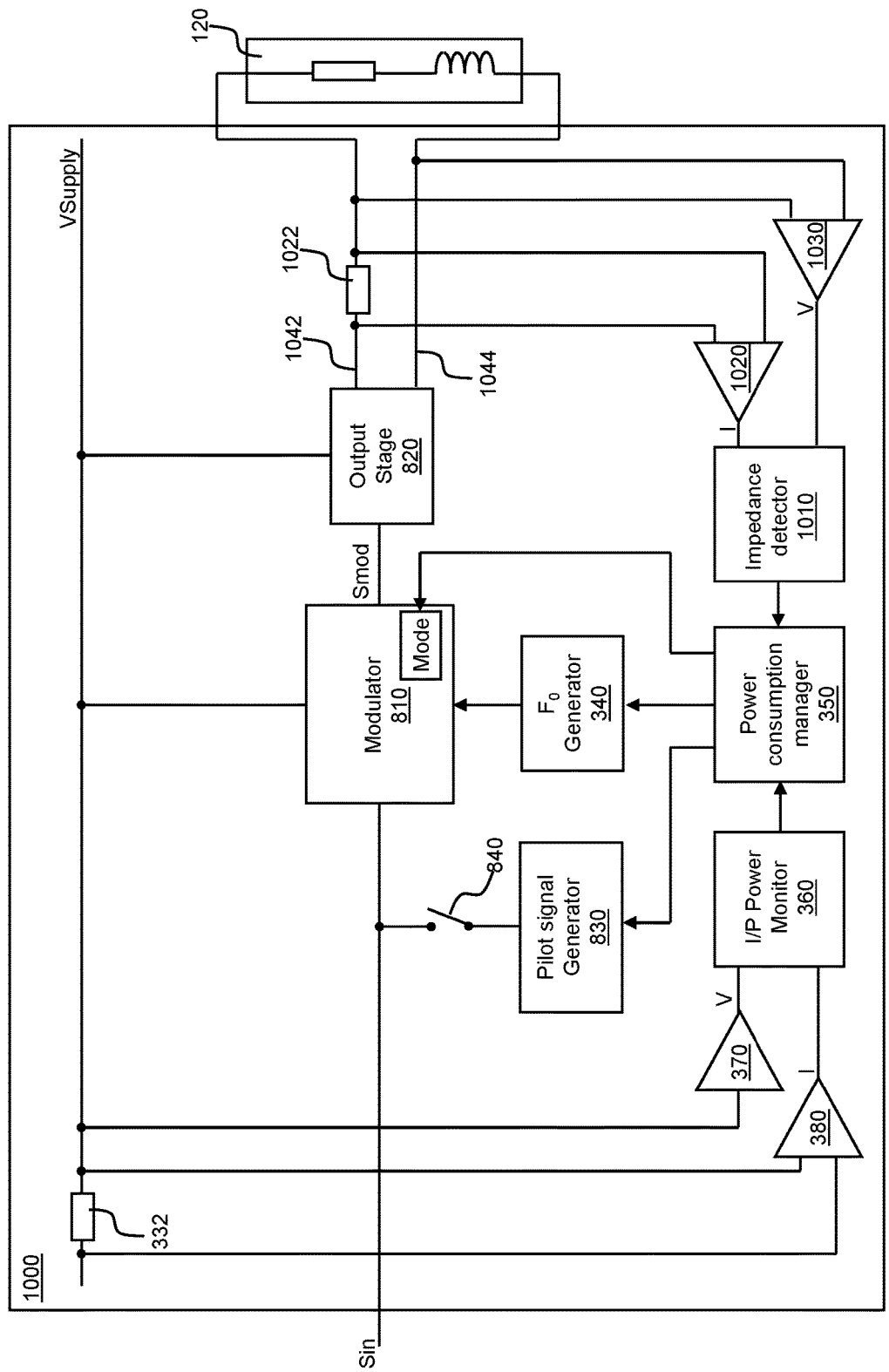
FIG. 10 is a schematic representation of further alternative example switching amplifier circuitry according to the present disclosure.

FIG. 10 is a schematic representation of further example switching amplifier circuitry for driving an inductive load 120 such as an audio transducer (e.g. a speaker or the like), a haptic transducer (e.g. a resonant actuator such as a linear resonant actuator) which includes circuitry for monitoring the impedance of the load.

The switching amplifier circuitry, shown generally at 1000 in FIG. 10, includes a number of elements in common with the switching amplifier circuitry 800 of FIG. 8. Such common elements are denoted by common reference numerals in FIGS. 8 and 10, and will not be described again in detail here for reasons of clarity and brevity.

The switching amplifier circuitry 1000 differs from the switching amplifier circuitry 800 in that it further includes load impedance detector circuitry 1010, output current sense amplifier circuitry 1020 having an output coupled to a first input of the load impedance detector circuitry 1010, an output current sense resistor 1022, and output voltage sense amplifier circuitry 1030 having an output coupled to a second input of the load impedance detector circuitry 1010.

In the example circuitry shown in FIG. 10 the output stage circuitry 820 comprises differential output stage circuitry (e.g. of the kind described above with reference to FIG. 6) having first and second output signal paths 1042, 1044 for coupling first and second outputs of the output stage circuitry 820 to respective first and second terminals of the load 120. However, it will be appreciated by those of ordinary skill in the art that the output stage circuitry 820 could equally be single-ended output stage circuitry (e.g. of the kind described above with reference to FIG. 4) having only a first output signal path 1042 for coupling the output of the output stage circuitry to a first terminal of the load 120, with a second terminal of the load 120 being coupled to ground or some other suitable reference voltage supply.

The output current sense resistor 1022 is provided in the first output signal path 1042, and first and second inputs of the output current sense amplifier circuitry 1020 are coupled to respective first and second terminals of the output current sense resistor 1022.

Thus the output current sense amplifier circuitry 1020 is configured to output a signal (e.g. a voltage) indicative of the current in the first output signal path 1042 (and thus through the load 120) to the first input of the load impedance detector circuitry 1010.

First and second inputs of the output voltage sense amplifier circuitry 1030 are coupled to the first and second output signal paths 1042, 1044 respectively, such that the output voltage sense amplifier circuitry is configured to output a signal (e.g. a voltage) indicative of an output voltage across the load 120. (In alternative examples in which the output stage circuitry 820 is single-ended, the output voltage sense amplifier circuitry 930 may have only a single input coupled to an output signal path from the output stage circuitry 820 to the load 120.)

Thus, the output voltage sense amplifier circuitry 1030 is configured to output a signal (e.g. a voltage) indicative of the voltage across the load 120 to the second input of the impedance detector circuitry 1010.

The impedance detector circuitry 1010 is configured to determine an impedance of the load 120 based on the signals received from the output current sense amplifier circuitry 1020 and the output voltage sense amplifier circuitry 1030 while a pilot or test signal is being supplied to the modulator circuitry 810, and to output a signal indicative of the impedance of the load 120 to the power consumption manager circuitry 350.

In operation of the switching amplifier circuitry 1000, a power optimisation sequence of the kind described above is performed to select an initial operational switching frequency for the modulator circuitry 810 based on the monitored input power to the modulator circuitry 810 and the output stage circuitry 820. As described above, this power optimisation sequence may involve switching the modulator circuitry 810 to a Class AD mode of operation and/or supplying a pilot or test tone to the modulator circuitry 810 to ensure that ripple current is generated in the load while the switching frequency is adjusted and the input power is monitored by the power consumption manager circuitry 350 to identify a switching frequency that optimises, minimises or at least reduces power consumption.

Once the power optimisation sequence has been completed and an initial operational switching frequency has been selected, the modulator circuitry 810 is switched into its Class BD mode of operation (e.g. in response to a suitable control signal from the power consumption manager circuitry 350) if necessary, and the pilot or test signal generator circuitry 830 is enabled and the switch 840 is closed (e.g. in response to suitable control signals from the power consumption manager circuitry 350). A pilot or test signal is thus supplied to the modulator circuitry 810, which in turn outputs a modulated output signal Smod to the output stage circuitry 820. The pilot or test tone may be supplied to the input of the modulator circuitry 810 in addition to an input signal Sin, or may be supplied to the input of the modulator circuitry 810 in the absence of an input signal Sin, e.g. by isolating the input of the modulator circuitry 810 from an input signal terminal of the switching amplifier circuitry 1000 by means of a switch in the input signal path.

The output stage circuitry 820 supplies a drive signal to the load 120, and the output current sense amplifier circuitry 1020 outputs a signal indicative of the load current to the impedance detector circuitry 1010. Similarly, the output voltage sense amplifier circuitry 1030 outputs a signal indicative of the voltage across the load to the impedance detector circuitry 1010. The impedance detector circuitry 1010 determines the impedance of the load 120 based on the signals received from the output current sense amplifier circuitry 1020 and the output voltage sense amplifier circuitry 1030, and outputs a signal indicative of the load impedance to the power consumption manager circuitry 350.

In response to the signal indicative of the impedance of the load 120, the power consumption manager circuitry 350 may compare the detected load impedance to a stored reference load impedance. The reference load impedance may be, for example, a reference load impedance value determined based on outputs of the output current sense amplifier circuitry 1020 and the output voltage sense amplifier circuitry 1030 during an initial calibration of the switching amplifier circuitry 1000. Alternatively, the reference load impedance may be a nominal or rated impedance value of the load 120 which is stored in a memory (e.g. a ROM or a RAM) of a host device that incorporates the switching amplifier circuitry 1000.

The power consumption manager may output a suitable control signal to adjust the switching frequency $F_O$ for the modulator circuitry 810 (which was selected as a result of a power optimisation sequence of the kind described above) based on a difference between the detected load impedance and the reference load impedance.

Additionally or alternatively, the power consumption manager circuitry 350 may output a suitable control signal to trigger the power optimisation sequence again to select a new switching frequency $F_O$ based on a difference between the detected load impedance and the reference load impedance.

For example, if a difference between the detected load impedance and the reference load impedance meets or exceeds a predefined threshold, the power consumption manager circuitry 350 may output the control signal(s) to adjust the operational switching frequency and/or trigger the power optimisation sequence to select a new operational switching frequency.

Monitoring the load impedance and adjusting the operational switching frequency in this way may improve power efficiency by optimising the operational switching frequency for the actual load impedance, which may differ from the reference load impedance due to temperature effects, ageing and the like.

Additionally or alternatively, the power consumption manager circuitry 350 may be operative to adjust the supply voltage VSupply based on the detected load impedance. For example, if the detected load impedance (or a resistive component of the detected load impedance) is lower than the reference load impedance, the power consumption manager circuitry 350 may be operative to reduce the supply voltage VSupply, e.g. by outputting a suitable control signal to a power source external to the switching amplifier circuitry, e.g. a power converter such as a DC-DC converter, that provides the supply voltage VSupply. This may have the effect of improving the power efficiency of the power converter without reducing the power delivered to the load.

In some cases characteristics such as the impedance of the load may be unknown or may be variable.

Figure 11:
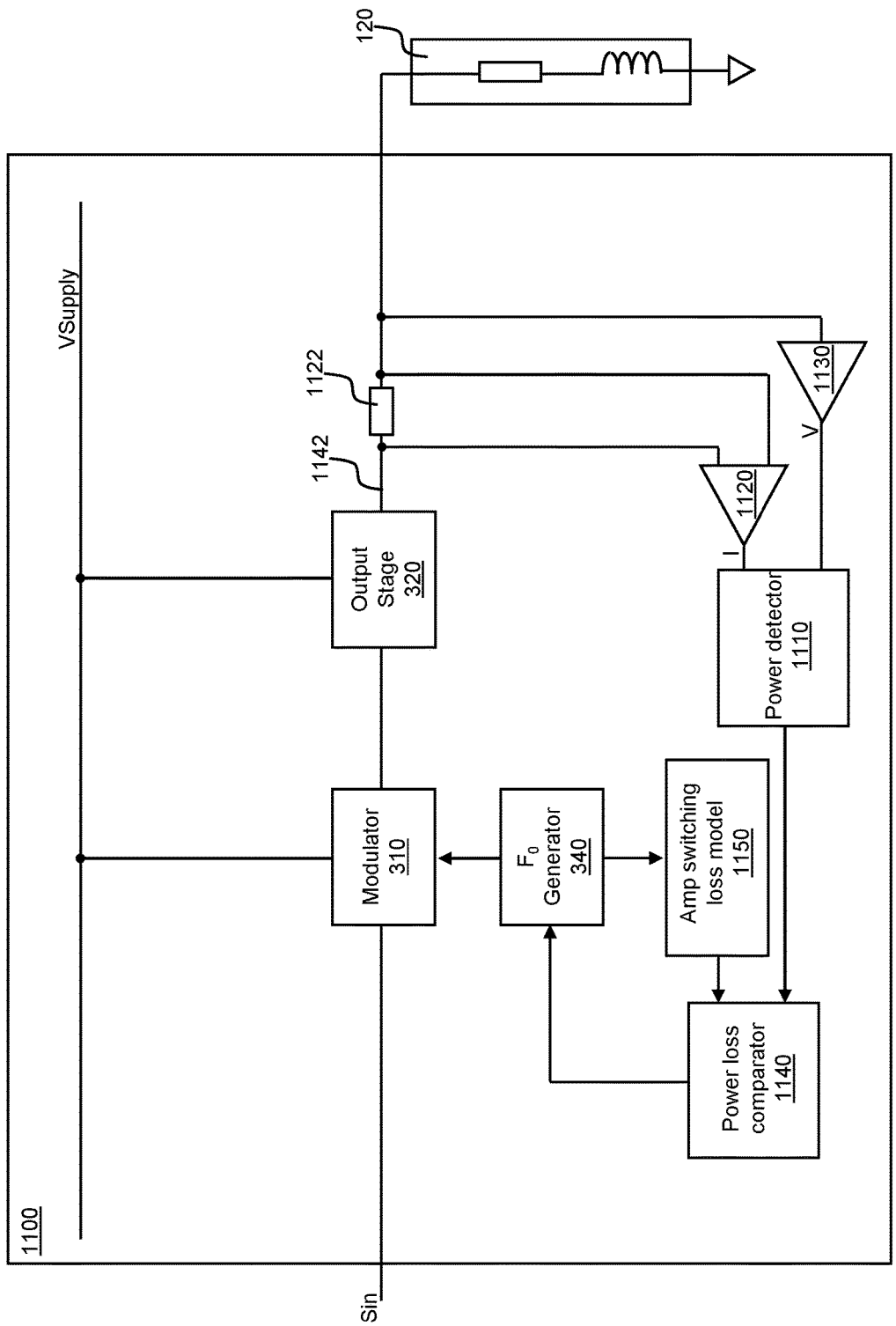
FIG. 11 is a schematic representation of further alternative example switching amplifier circuitry according to the present disclosure.

FIG. 11 is a schematic representation of further example switching amplifier circuitry for driving an inductive load 120 such as an audio transducer (e.g. a speaker or the like), a haptic transducer (e.g. a resonant actuator such as a linear resonant actuator) which includes circuitry for monitoring the voltage across the load and the current through the load.

The switching amplifier circuitry, shown generally at 1100 in FIG. 11, includes a number of elements in common with the switching amplifier circuitry 300 of FIG. 3. Such common elements are denoted by common reference numerals in FIGS. 3 and 11, and will not be described again in detail here for reasons of clarity and brevity.

The switching amplifier circuitry 1100 differs from the switching amplifier circuitry 300 in that it further includes load ripple power detector circuitry 1110, output current sense amplifier circuitry 1120 having an output coupled to a first input of the load ripple power detector circuitry 1110, an output current sense resistor 1122, and output voltage sense amplifier circuitry 1130 having an output coupled to a second input of the load ripple power detector circuitry 1110. The switching amplifier circuitry 1100 further includes power loss comparator circuitry 1140 and an amplifier switching loss model 1150.

In the example circuitry shown in FIG. 11 the output stage circuitry 320 comprises single-ended output stage circuitry (e.g. of the kind described above with reference to FIG. 4) having an output signal path 1142 for coupling an output of the output stage circuitry 320 to a first terminal of the load 120, with a second terminal of the load being coupled to ground or some other reference voltage. However, it will be appreciated by those of ordinary skill in the art that the output stage circuitry 320 could equally be differential output stage circuitry (e.g. of the kind described above with reference to FIG. 6) having only first and second output signal paths for coupling the outputs of the output stage circuitry to the first and second terminals of the load 120.

The output current sense resistor 1122 is provided in the output signal path 1142, and first and second inputs of the output current sense amplifier circuitry 1120 are coupled to respective first and second terminals of the output current sense resistor 1122.

Thus the output current sense amplifier circuitry 1120 is configured to output a signal (e.g. a voltage) indicative of the current in the output signal path 1142 (and thus through the load 120) to the first input of the load ripple power detector circuitry 1110.

An input of the output voltage sense amplifier circuitry 1130 is coupled to the output signal path 1142, such that the output voltage sense amplifier circuitry is configured to output a signal (e.g. a voltage) indicative of an output voltage across the load 120. (In alternative examples in which the output stage circuitry 320 is differential output stage circuitry, the output voltage sense amplifier circuitry 1130 may have first and second inputs coupled to respective first and second output signal paths from the output stage circuitry 320 to the load 120.)

Thus, the output voltage sense amplifier circuitry 1130 is configured to output a signal (e.g. a voltage) indicative of the voltage across the load 120 to the second input of the load ripple power detector circuitry 1110.

The load ripple power detector circuitry 1110 is configured to determine a power associated with the load ripple current based on the signals received from the output current sense amplifier circuitry 1120 and the output voltage sense amplifier circuitry 1130 (e.g. by multiplying the load current signal by the load voltage signal), and to output a signal indicative of the power associated with the load ripple current to the power loss comparator circuitry 1140.

The power loss comparator circuitry 1140, which may be implemented in processing circuitry such as digital signal processor (DSP) circuitry or the like, is configured to compare the power loss associated with the load ripple current (as represented by the signal output by the load ripple power detector circuitry 1110) to a modelled switching power loss of the switching amplifier circuitry 1100, represented by an output of the amplifier switching loss model 1150. Based on this comparison the power loss comparator circuitry 1140 outputs a control signal to the switching frequency generator circuitry 340 to control the operational switching frequency of the modulator circuitry 310 to achieve an optimum or at least improved balance between amplifier switching losses and load ripple current losses, to optimise, minimise or at least reduce the power consumption of the switching amplifier circuitry 1100.

The amplifier switching loss model 1150 may be stored in memory such as a ROM or RAM of a host device incorporating the switching amplifier circuitry 1100. The amplifier switching loss model 1150 includes a capacitive switching loss model which models the capacitive power losses that arise due to the capacitances (e.g. gate capacitances) of the switches of the output stage circuitry 320 and/or parasitic capacitances in the switching amplifier circuitry 1100, and a resistive switching loss model which models the resistive power losses that arise due to slewing of the switches of the output stage circuitry 320 through their active regions.

The amplifier switching loss model 1150 receives an input signal indicative of the current operational switching frequency of the modulator circuitry 310 from the switching frequency generator circuitry 340, and outputs a signal indicative of the total of the capacitive switching power losses and the resistive switching power losses in the switching amplifier circuitry 1100 for that operational switching frequency to the power loss comparator circuitry 1140.

The power loss comparator circuitry 1140 compares the total of the capacitive and resistive switching power losses for the current operational switching frequency to the detected ripple current power losses, as represented by the output of the ripple power loss detector circuitry 1110, and outputs a control signal to the switching frequency generator circuitry 340 to adjust the operational switching frequency based on the result of the comparison.

For example, if the total of the capacitive and resistive switching power losses is greater than the ripple current power losses, the power loss comparator circuitry 1140 may output a control signal to cause the operational switching frequency to be reduced. On the other hand, if the total of the capacitive and resistive switching power losses is less than the ripple current power losses, the power loss comparator circuitry 1140 may output a control signal to cause the operational switching frequency to be increased. If the total of the capacitive and resistive switching power losses is equal to the ripple current power losses, the power loss comparator circuitry 1140 may output a control signal to cause the current operational switching frequency to be maintained.

Thus an operational switching frequency that optimises or at least improves the balance between capacitive and resistive switching power losses and ripple current power losses can be identified and selected to optimise, minimise or at least reduce the power consumption of the switching amplifier circuitry 1100 when driving a load with unknown or variable characteristics.

Figure 12:
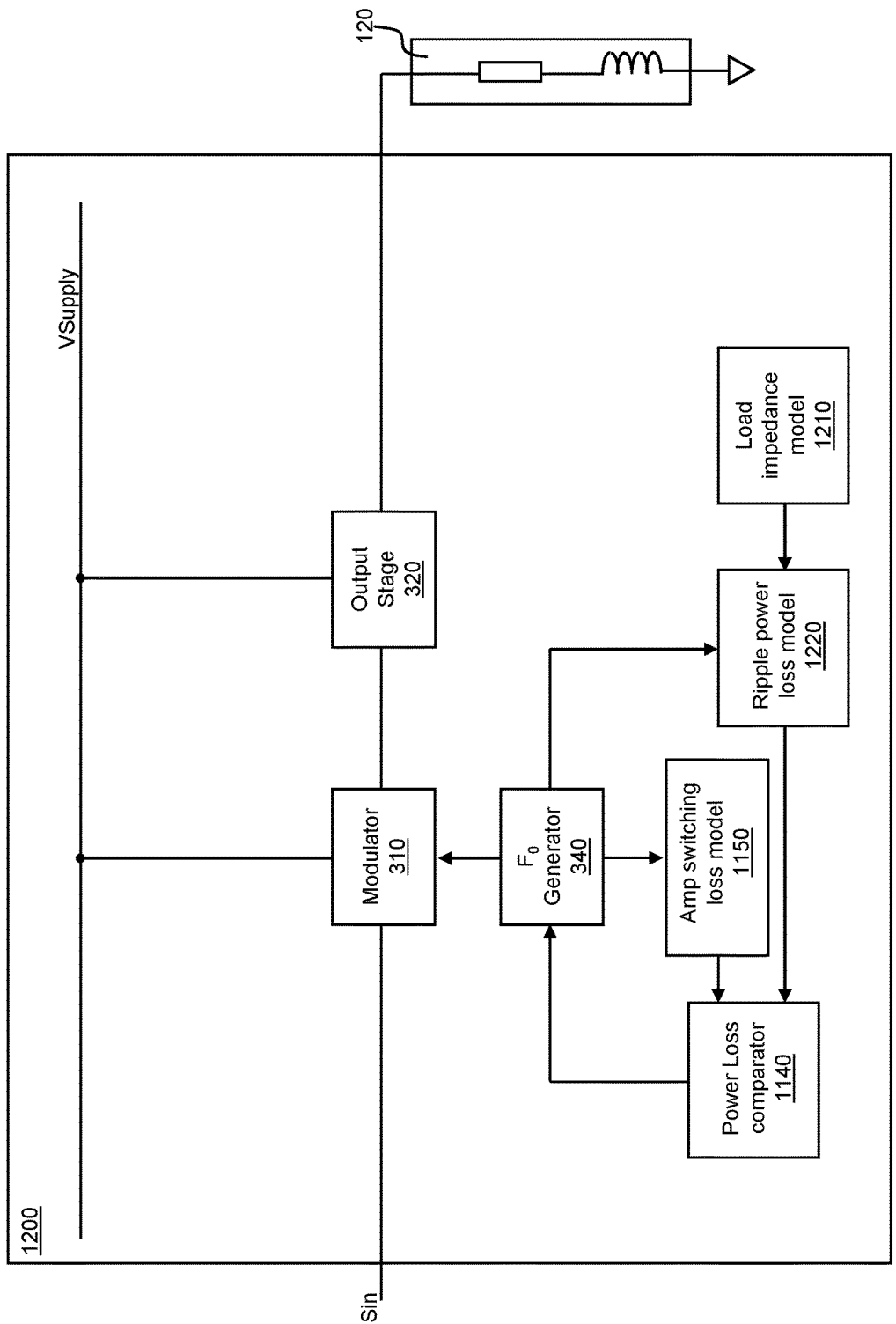
FIG. 12 is a schematic representation of further alternative example switching amplifier circuitry according to the present disclosure.

FIG. 12 is a schematic representation of further example switching amplifier circuitry for driving an inductive load 120 such as an audio transducer (e.g. a speaker or the like), a haptic transducer (e.g. a resonant actuator such as a linear resonant actuator).

The switching amplifier circuitry, shown generally at 1200 in FIG. 12, includes a number of elements in common with the switching amplifier circuitry 1100 of FIG. 11. Such common elements are denoted by common reference numerals in FIGS. 11 and 12, and will not be described again in detail here for reasons of clarity and brevity.

The switching amplifier circuitry 1200 differs from the switching amplifier circuitry 1100 in that in place of the load ripple power detector circuitry 1110, output current sense amplifier circuitry 1120, output current sense resistor 1122 and output voltage sense amplifier circuitry 1130, the switching amplifier circuitry includes a load impedance model 1210 and a ripple power loss model 1220.

The load impedance mode 1210 may be stored in memory such as a ROM or RAM of a host device incorporating the switching amplifier circuitry 1200, and models the resistance and inductance of the load 120.

The ripple power loss model 1220 may also be stored in memory such as a ROM or RAM of a host device incorporating the switching amplifier circuitry 1200, and is configured to receive a signal indicative of the current operational switching frequency from the switching frequency generator 320 and to generate an estimated ripple power loss measurement for the current operational switching frequency based on the inductance and/or resistance of the load 120 as provided by the load impedance model 1210.

The ripple power loss model 1220 outputs a signal indicative of the estimated ripple current power loss at the current operational switching frequency to the power loss comparator circuitry 1140.

As in the switching amplifier circuitry 1100 of FIG. 11, the power loss comparator circuitry 1140 is configured to compare the signal indicative of the ripple current power loss to a signal indicative of the combined capacitive and resistive switching power losses output by the amplifier switching loss model 1150 and to output a control signal to the switching frequency generator 340 to increase, decrease or maintain the operational switching frequency, based on the result of the comparison.

Thus, if the total of the capacitive and resistive switching power losses is greater than the ripple current power losses, the power loss comparator circuitry 1140 may output a control signal to cause the operational switching frequency to be reduced. If the total of the capacitive and resistive switching power losses is less than the ripple current power losses, the power loss comparator circuitry 1140 may output a control signal to cause the operational switching frequency to be increased. If the total of the capacitive and resistive switching power losses is equal to the ripple current power losses, the power loss comparator circuitry 1140 may output a control signal to cause the current operational switching frequency to be maintained.

Thus an operational switching frequency that optimises or at least improves the balance between capacitive and resistive switching power losses and ripple current power losses can be identified and selected to optimise or at least reduce the power consumption of the switching amplifier circuitry 1100 when driving a load whose characteristics are known.

The circuitry and methods described above with reference to the accompanying drawings enable an optimal or at least beneficial operational switching frequency for the modulator circuitry in the switching amplifier circuitry to be selected, to provide an optimal or improved balance capacitive and resistive switching power losses in the switching amplifier circuitry and ripple current power losses in the load, thereby optimising, minimising or at least reducing the power consumption of the switching amplifier circuitry.

Adjustment of the operational switching frequency in the manner described above may be performed on a one-time basis, e.g. during a production test process for a host device incorporating any of the above-described examples of switching amplifier circuitry, or during a tuning process performed during or after manufacture of the switching amplifier circuitry to tune the switching amplifier circuitry to a particular operational switching frequency that corresponds to a specified or rated operational frequency of an output transducer.

Additionally or alternatively, such adjustment of the operational switching frequency may be performed as part of a start-up sequence of the amplifier circuitry, and/or may be initiated periodically or intermittently by a host device incorporating any of the above-described examples of switching amplifier circuitry. Additionally or alternatively, such adjustment of the operational switching frequency may be initiated if the power consumption of the switching amplifier circuitry meets or exceeds a predetermined threshold. As a further alternative, the operational switching frequency may be continually adjusted using any of the above-described methods to maintain optimum, minimum or at least reduced power consumption of the switching amplifier circuitry.

In the examples described above, the switching frequency generator and the input and/or output power monitor circuitry are provided as part of the switching amplifier circuitry However, in other examples, the switching frequency of the modulator circuitry may be controlled by a host device that incorporates the switching amplifier circuitry, and the input and/or output power may be monitored by the host device to facilitate the identification and selection of an optimum or at least beneficial operational switching frequency that optimises or at least reduces the power consumption of the switching amplifier circuitry.

The circuitry described above with reference to the accompanying drawings may be implemented in integrated circuitry, e.g. as one or more integrated circuits. The circuitry described above with reference to the accompanying drawings (whether implemented as discrete circuitry or integrated circuitry) may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Switching amplifier circuitry for driving a load, the switching amplifier circuitry comprising:
   modulator circuitry; and
   output stage circuitry, wherein the switching amplifier circuitry is configured to:
      while the modulator circuitry is outputting a modulated output signal that gives rise to ripple current in the load:
         adjust a switching frequency of the modulator circuitry over a predetermined range of frequencies;
         monitor an input power to the switching amplifier circuitry as the switching frequency is adjusted over the predetermined range of frequencies; and
         select, as an operational switching frequency for the modulator circuitry, a frequency within the predetermined range of frequencies at which the monitored input power meets a predefined criterion.

2. The switching amplifier circuitry according to claim 1, wherein:
   the switching amplifier circuitry further comprises input power monitoring circuitry for monitoring the input power,
   and wherein the switching amplifier circuitry is configured to select, as the operational switching frequency, a frequency within the predetermined range of frequencies at which a minimum monitored input power to the switching amplifier circuitry occurs.

3. The switching amplifier circuitry according to claim 2, wherein the input power monitoring circuitry comprises input current monitor circuitry for monitoring an input current to the switching amplifier circuitry.

4. The switching amplifier circuitry according to claim 3, wherein the input power monitoring circuitry further comprises input voltage monitor circuitry for monitoring an input voltage to the switching amplifier circuitry.

5. The switching amplifier circuitry according to claim 1, wherein the modulator circuitry comprises Class D modulator circuitry operable in a Class BD operating mode or a Class AD operating mode.

6. The switching amplifier circuitry according to claim 5, wherein the output stage circuitry comprises single ended output stage circuitry, and wherein the modulator circuitry is operable in its Class AD operating mode or its Class BD operating mode to output the modulated output signal that gives rise to ripple current in the load.

7. The switching amplifier circuitry according to claim 5, wherein the output stage circuitry comprises differential output stage circuitry, and wherein the modulator circuitry is operable in its class AD operating mode to output the modulated output signal that gives rise to ripple current in the load.

8. The switching amplifier circuitry according to claim 5, wherein:
   the switching amplifier circuitry further comprises pilot or test signal generator circuitry operable to supply a pilot or test signal to an input of the modulator circuitry;
   the output stage circuitry comprises differential output stage circuitry; and
   the modulator circuitry is operable in its Class BD operating mode to output a modulated output signal that gives rise to ripple current in the load based on the pilot or test signal.

9. The switching amplifier circuitry according to claim 8, wherein the pilot or test signal comprises:
   a sinusoidal signal having predefined amplitude and/or frequency and/or phase characteristics;
   a variable amplitude sinusoidal signal; or
   a DC signal of fixed or variable amplitude.

10. The switching amplifier circuitry according to claim 1, wherein the switching amplifier circuitry is configured to have zero PWM switching at idle, wherein the switching amplifier circuitry further comprises pilot or test signal generator circuitry operable to supply a pilot or test signal to an input of the modulator circuitry, and wherein the modulator circuitry is operable to output a modulated output signal that gives rise to ripple current in the load based on the pilot or test signal.

11. The switching amplifier circuitry according to claim 1, wherein the switching amplifier circuitry is configured to have zero PWM switching at idle, wherein the switching amplifier circuitry comprises multi-mode modulator circuitry, and wherein the multi-mode modulator circuitry is operable to change its operating mode so as to output a modulated output signal that gives rise to ripple current in the load when no input signal is present.

12. The switching amplifier circuitry according to claim 1, wherein:
   the monitored input power comprises an output power of the switching amplifier circuitry;
   the switching amplifier circuitry further comprises load ripple current power monitoring circuitry for monitoring the output power; and,
   the switching amplifier circuitry is configured to select, as the operational switching frequency, a frequency within the predetermined range of frequencies at which a minimum monitored output power of the switching amplifier circuitry occurs.

13. The switching amplifier circuitry according to claim 12, wherein the load ripple current power monitoring circuitry comprises load current monitor circuitry and load voltage monitor circuitry.

14. The switching amplifier circuitry according to claim 5, wherein the switching amplifier circuitry is operable to change the operating mode of the modulator circuitry based on a characteristic or parameter of an input signal to the switching amplifier circuitry, and wherein the operational switching frequency is selected based at least in part on an average input power over time for the Class AD operating mode and the Class BD operating mode.

15. The switching amplifier circuitry according to claim 5, wherein:
the switching amplifier circuitry is operable to change the operating mode of the modulator circuitry based on a characteristic or parameter of an input signal to the switching amplifier, and wherein the switching amplifier circuitry is configured to adjust the operational switching frequency based on a current or future operating mode of the modulator circuitry.

16. The switching amplifier circuitry according to claim 1, wherein a modulation index of the modulated output signal is variable.

17. The switching amplifier circuitry according to claim 2, wherein the switching amplifier circuitry further comprises load impedance detector circuitry configured to detect an impedance of the load, wherein the switching amplifier circuitry is operable to adjust the operational switching frequency based on a difference between the detected impedance of the load and a reference impedance for the load.

18. The switching amplifier circuitry according to claim 17, wherein the reference impedance for the load comprises a stored predefined impedance value or a stored calibration impedance value determined during a calibration of the switching amplifier circuitry.

19. The switching amplifier circuitry according to claim 17, wherein the load impedance detector circuitry is configured to detect the impedance of the load based on a voltage across the load and a current through the load as a pilot or test signal of a predetermined frequency is input to the modulator circuitry.

20. The switching amplifier circuitry according to claim 2, wherein the switching amplifier circuitry receives a supply voltage from a power source external to the switching amplifier circuitry, wherein the supply voltage is adjustable based on a detected impedance of the load.

21. The switching amplifier circuitry according to claim 1, wherein the switching amplifier circuitry is configured to adjust the switching frequency of the modulator circuitry:
during a production process of the switching amplifier circuitry; and/or
on start-up of the switching amplifier circuitry; and/or
in response to a periodic initiation signal received from a host device that incorporates the switching amplifier circuitry; and/or
continuously; and/or
in response to a power consumption of the switching amplifier circuitry straying outside of a predefined limit; and/or
in response to a change in one or more characteristics of the load; and/or
in response to a change in an operating characteristic of the switching amplifier circuitry.

22. The switching amplifier circuitry according to claim 1, wherein the modulator circuitry comprises pulse width modulator (PWM) circuitry.

23. The switching amplifier circuitry according to claim 1, wherein the switching amplifier circuitry is configured to monitor the power continuously, intermittently or periodically.

24. Switching amplifier circuitry for driving a load, the switching amplifier circuitry comprising:
modulator circuitry;
output stage circuitry; and
power loss comparator circuitry,
wherein the power loss comparator circuitry is configured to perform a comparison of a power loss associated with a ripple current in the load to a switching loss model for the switching amplifier circuitry,
wherein the power loss associated with the ripple current in the load is based on a ripple power loss model for the switching amplifier circuitry, wherein the ripple power loss model is configured to generate an estimated ripple power loss measurement for a current operational frequency of the switching amplifier circuitry based on an inductance and/or a resistance of the load,
and wherein the switching amplifier circuitry is configured to control a switching frequency of the modulator circuitry based on the comparison.

25. The switching amplifier circuitry according to claim 24, wherein the switching amplifier circuitry further comprises output power detector circuitry configured to generate a signal indicative of the power loss associated with the ripple current.

26. An integrated circuit comprising switching amplifier circuitry according to claim 1.

27. A host device comprising switching amplifier circuitry according to claim 1.

28. The host device according to claim 27, wherein the host device comprises:
a laptop, notebook netbook, or tablet computer;
a gaming device, a games console;
a controller for a games console;
a virtual reality (VR) or augmented reality (AR) device;
a mobile telephone;
a portable audio player;
a portable device; or
an accessory device for use with:
a laptop, notebook, netbook or tablet computer;
a gaming device;
a games console;
a VR or AR device;
a mobile telephone;
a portable audio player; or
another portable device.

* * * * *